(12) United States Patent
Shibuya

(10) Patent No.: US 9,148,134 B2
(45) Date of Patent: Sep. 29, 2015

(54) DATA DRIVER, DISPLAY PANEL DRIVING DEVICE, AND DISPLAY DEVICE

(71) Applicant: RENESAS ELECTRONICS CORPORATION, Kawasaki-shi, Kanagawa (JP)

(72) Inventor: Masaki Shibuya, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 215 days.

(21) Appl. No.: 13/677,878

(22) Filed: Nov. 15, 2012

(65) Prior Publication Data

US 2013/0141403 A1 Jun. 6, 2013

(30) Foreign Application Priority Data

Dec. 6, 2011 (JP) .................................. 2011-266865

(51) Int. Cl.
 *G06F 3/038* (2013.01)
 *H03K 5/15* (2006.01)
 *G09G 5/00* (2006.01)
 *G09G 3/36* (2006.01)

(52) U.S. Cl.
 CPC ................ *H03K 5/15* (2013.01); *G09G 3/3688* (2013.01); *G09G 5/00* (2013.01); *G09G 2300/0426* (2013.01); *G09G 2310/0291* (2013.01); *G09G 2310/08* (2013.01); *G09G 2320/0223* (2013.01); *G09G 2330/025* (2013.01)

(58) Field of Classification Search
 CPC .............. G09G 2310/0264; G09G 2310/0267; G09G 2310/027; G09G 2310/0272; G09G 2310/0275; G09G 2310/0278; G09G 2310/0291; G09G 2320/0223; G09G 3/3674; G09G 3/3677; G09G 3/2681
 USPC ....................... 345/10–29, 98–100, 204–215; 327/269–273
 See application file for complete search history.

(56) References Cited

U.S. PATENT DOCUMENTS

| | | | | |
|---|---|---|---|---|
| 2009/0058788 | A1* | 3/2009 | Ha et al. ........................... | 345/99 |
| 2010/0194731 | A1* | 8/2010 | Hiratsuka ..................... | 345/211 |
| 2011/0074745 | A1* | 3/2011 | Chang et al. .................. | 345/204 |

FOREIGN PATENT DOCUMENTS

JP 2010-176083 A 8/2010

* cited by examiner

*Primary Examiner* — Michael Pervan
*Assistant Examiner* — Andrew Lee
(74) *Attorney, Agent, or Firm* — Sughrue Mion, PLLC

(57) ABSTRACT

To reduce current noise by reducing the current peak value and the current rise slope, a data driver includes a delay unit and a plurality of output circuits. The delay unit sequentially delays a control signal and outputs delay control signals. The output circuits start outputting in response to the delay control signals. The delay unit generates the delay control signals to be output to the output circuits.

11 Claims, 20 Drawing Sheets

US 9,148,134 B2
// 1

DATA DRIVER, DISPLAY PANEL DRIVING DEVICE, AND DISPLAY DEVICE

CROSS-REFERENCE TO RELATED APPLICATIONS

The disclosure of Japanese Patent Application No. 2011-266865 filed on Dec. 6, 2011 including the specification, drawings and abstract is incorporated herein by reference in its entirety.

BACKGROUND

The present invention relates to a data driver, a display panel driving device, and a display device.

There is known a liquid crystal display (LCD) panel of active matrix type. This liquid crystal display panel includes scan (gate) lines arranged in parallel in the row direction, data lines arranged in parallel in the column direction, pixels placed at the intersections of the scan and data lines, and an active element (for example, thin film transistor (TFT)) provided in each pixel. When the active element is a TFT, the scan line is coupled to the gate electrode. Then, the data line is coupled to the drain electrode. One end of the liquid crystal capacitance, which is an equivalent capacitive load, is coupled to the source electrode. The other end of the liquid crystal capacitance is coupled to a common electrode line. A gate driver (scan line driving circuit) is coupled to the scan line, and a data driver (data line driving circuit) is coupled to the data line.

In the liquid crystal display panel, the scan lines are scanned in order from the top to the bottom by the gate driver, in order to apply a voltage to the liquid crystal capacitance from the data driver through the active element provided in each pixel. The data driver includes an output amplifier to apply the voltage to a plurality of data lines. The output amplifier includes a plurality of amplifier circuits. In the liquid crystal display panel, the alignment of liquid crystal molecules varies according to the voltage applied to the liquid crystal capacitance from the outputs of the amplifier circuits. Thus, the transmittance of light varies accordingly.

Recently the performance of the liquid crystal display panel has been improved, and a low power consumption, low noise, and high speed data driver is required to reduce the voltage of the circuit power supply. However, the low voltage of the circuit power supply can easily lead to an operation failure due to electrical noise. Thus, it is necessary to establish a circuit design by taking into account the importance of the noise problem. In particular, the data driver has a low voltage part including a logic unit and an interface unit, as well as a high voltage part including an amplifier circuit for driving the data line of the liquid crystal display panel. Thus, it is necessary for the data driver to reduce strong noise generated in the operation of the amplifier circuit, in order to prevent incorrect operation in the low voltage part.

As an example of the related art, Japanese Unexamined Patent Publication No. 2010-176083 (corresponding to US patent publication No. 2010/0194731(A1)) discloses a (data) driver and a display device. FIG. 1 is a block diagram of a data driver disclosed in Japanese Unexamined Patent Publication No. 2010-176083. The data driver includes an amplifier circuit drive unit 138 and a plurality of amplifier circuits 136-1 to 136-N. The amplifier circuit drive unit 138 outputs control signals CTR1 and CTR2 to the amplifier circuits 136-1 to 136-N. Each of the amplifier circuits 136-1 to 136-N outputs an output gradation voltage to a data line of a display unit (liquid crystal display panel) in response to the control signals CTR1 and CTR2. The amplifier circuit drive unit 138 includes a control circuit 140 and delay units 141, 142, and 143. The control circuit 140 outputs the control signal CTR1 to the delay unit 141. The control circuit 140 also outputs the control signal CTR2, which is the control signal CTR1 delayed by the delay unit 142, to the delay unit 143. The delay unit 141 sequentially delays the control signal CTR1, and outputs it to a first group of amplifier circuits 136-1 to 136-(N/2) that are one-half of the amplifier circuits. The delay unit 143 sequentially delays the control signal CTR2, and outputs it to a second group of amplifier circuits 136-((N/2)+1) to 136-N) that are the other half of the amplifier circuits.

FIG. 2 is a timing chart showing waveforms of control signals input to the amplifier circuits 136-1 to 136-N from an amplifier circuit drive unit 88. The control circuit 140 outputs the control signal CTR1 as a control signal. The delay unit 141 outputs the control signal CTR1 in order with a uniform delay to the first group of the amplifier circuits 136-1 to 136-(N/2). The delay unit 143 outputs the control signal CTR2, which is the control signal CTR1 delayed by an arbitrary amount by the delay unit 142, to the second group of the amplifier circuits 136-((N/2)+1) to 136-N in order with a uniform delay.

SUMMARY

The inventors have obtained the following facts on the technology disclosed in Japanese Unexamined Patent Publication No. 2010-176083. FIG. 3 is a schematic diagram showing an example of a typical data driver 101. This chip layout image, which is not described in Japanese Unexamined Patent Publication No. 2010-176083, is made by the inventors as an example of the case in which Japanese Unexamined Patent Publication No. 2010-176083 is actually applied. In this figure, the reference number of the data driver 101 is changed from the reference number of the data driver in FIG. 1. In the example of this figure, it is shown the so-called semi-slim layout as the chip layout in which the number of outputs is 960 and output terminals are arranged in the vicinity of the two long sides of a chip.

The data driver 101 includes a control circuit 102, an amplifier circuit 103, and a delay circuit 104. The amplifier circuit 103 has four amplifier circuit groups with 240 outputs each on the bottom and top on the right side of the figure as well as on the top and bottom on the left side of the figure, according to the location of the amplifier circuit 103 in the data driver 101. In other words, the amplifier circuit 103 has four groups of amplifier circuits 103-1 to 103-240, 103-241 to 103-480, 103-481 to 103-720, and 103-721 to 103-960. Thus, the amplifier circuit 103 has 960 amplifier circuits in total. The delay circuit 104 is provided corresponding to the amplifier circuit 103. The delay circuit 104 has four groups of delay circuits 104-1 to 104-240, 104-241 to 104-480, 104-481 to 104-720, and 104-721 to 104-960. Thus, the delay circuit 104 has 960 delay circuits in total. The control circuit 102 outputs CTR as a control signal to the delay circuit 104. The delay circuits 104-1 to 104-960 sequentially output the control signal CTR to the amplifier circuits 103-1 to 103-960, allowing the amplifier circuits 103-1 to 103-960 to operate in order at equal time intervals. With respect to the output timing of the amplifier circuit 103, the amplifier circuits 103-1 and 103-960 output first, and the amplifier circuits 103-480 and 103-481 output last. Note that in terms of the relationship with FIG. 1, the control circuit 140 and the delay circuits 141-1 to 141-3 shown in FIG. 1 correspond to the control circuit 102 and to the delay circuits 104-1 to 104-960, respectively. Further, the amplifier circuits 136-1 to 136-N correspond to the amplifier circuits 103-1 to 103-960.

FIG. 4 is a graph schematically showing an example of the waveform of the output voltage of each amplifier circuit shown in FIG. 3. The vertical axis represents the output voltage (V) and the horizontal axis represents the time (output timing: seconds). The output voltages rise in order at fixed time intervals. In other words, each amplifier circuit outputs a specified voltage with a uniform time difference. At this time, the amplifier circuits 103-1 and 103-960 output the output voltage first, the amplifier circuits 103-241 and 103-720 output the output voltage halfway, and the amplifier circuits 103-480 and 103-481 output the output voltage last.

FIG. 5 is a schematic diagram showing an example of the configuration of a display panel driving device including the data driver 101 in a typical film carrier package 110. The data driver 101 is mounted on the package 110. The outputs of the amplifier circuits 103-1 to 103-960 are coupled to data lines of the liquid crystal display panel coupled to nodes 105-1 to 105-960 through the signal lines 112, respectively. In the case of the package layout shown in FIG. 5, in the range of the amplifier circuits 103-1 to 103-240 and 103-721 to 103-960, the length of the signal line 112 is gradually increased from the signal lines 112 of the amplifier circuits 103-240 and 103-721 (the signal lines 112 coupled to the nodes 105-240, 105-721), and the length of the signal lines 112 of the amplifier circuits 103-1, 103-960 (the signal lines 112 coupled to the nodes 105-1, 105-960) is the longest. In the range of the amplifier circuits 103-241 to 103-480 and 103-481 to 103-720, the length of the signal line 112 is substantially constant and is shorter than the length of the signal lines 112 of the amplifier circuits 103-240 and 103-721.

FIG. 6 is a graph schematically showing an example of the waveform of the power supply current of the data driver shown in FIG. 5, together with the example of the output voltage waveform of the individual amplifier circuits (FIG. 4). The vertical axis represents the power supply current (A) and the output voltage (V) of the amplifier circuit, while the horizontal axis represents the time (output timing: seconds). The upper graph is FIG. 4 with the 0 point shifted. The lower graph is the power supply current of the amplifier circuit. The waveform of the power supply current is an example when the output load capacitance of the display panel driving device is small, or when the line resistance of the coupled data line is large. The range A in the figure shows the power supply current with respect to the amplifier circuits 103-1 to 103-120, 103-841 to 103-960. The range B in the figure shows the power supply current with respect to the amplifier circuits 103-121 to 131-240, 103-721 to 103-840. The range C in the figure shows the power supply current with respect to the amplifier circuits 103-241 to 103-720. The thick line graph is a graph showing the total power supply current, in which a plurality of power supply currents in the range A, a plurality of power supply currents in the range B, and a plurality of power supply currents in the range C are overlapped. Note that for ease of understanding, FIG. 6 schematically shows the waveform of the power supply current for each output of the amplifier circuit.

The load of the signal line 112 driven by the amplifier circuit 103 increases in proportion to the length of the signal line 112 of the package 110 coupled to the amplifier circuit 103. For example, as shown in FIG. 7, parasitic capacitance $C_i$ ($C_1$, $C_2$, and $C_{N-1}$) occurs between each of the tape shaped signal lines (signal lines 112). When the line distance is fixed (for example, the minimum value) with the same line film thickness, the parasitic capacitance $C_i$ will increase as the length of the signal line increases. For this reason, when the output voltage is supplied to the panel load (the data line of the liquid crystal display panel) from AMP (amplifier circuit 103) through the tape shaped signal line (signal line 112), the load will increase as the signal line increases due to the influence of the parasitic capacitance $C_i$. Thus, the signal line 112 in the group of the range A is relatively long, so that the load is relatively large. The signal line 112 in the group of the range C is relatively short, so that the load is relatively small. The length of the signal line 112 in the group of the range B is medium. In this case, in the initial stage of the output of the data driver, the output is performed by the group of the range A in which the load is large. Thus, as shown in the graph of the total power supply current (thick line graph), the power supply current (power supply current I in FIG. 7) rapidly increases at the start of the output by the amplifier circuits 103-1, 103-960. At the same time, both the current peak value and the slope of rising current waveform (dI/dt) increase.

Such a rapid increase in the current peak value causes a voltage drop due to the resistance component of the power supply line, resulting in a power supply voltage drop to other circuits that share the power supply line. Further, the slope of the rising current waveform (dI/dt) causes noise in other signal lines due to the capacitive coupling (parasitic capacitance) and the mutual induction. The noise due to the height of the current peak value and due to the magnitude of the slope of the rising current waveform enters the low-voltage logic unit and the interface unit, causing incorrect operation of the circuit.

Note that in FIG. 3, the description of the delay circuit 142 for delaying the timing of the left-right operation in FIG. 1 is omitted for a simple description. However, even if the delay circuit 142 is present, the problem only occurs with a delay between the left and right of the chip at a delay time of the delay circuit 142, so that the essential is the same in FIG. 3 and FIG. 1.

Further, the above description exemplifies the data driver of the liquid crystal display. However, this same problem can be applied to the data driver of other types of display having the same function. In addition, the above description exemplifies the analog circuit (amplifier circuit-signal line-display panel load). However, the same problem can also be applied to a digital circuit having the same function. In other words, when a plurality of digital data pieces are simultaneously output, noise and power supply voltage drop occur due to the load capacitance of the signal lines arranged in parallel.

Hereinafter, means for solving the problems will be described using numbers and symbols that are used in the description of the preferred embodiments. These numbers and symbols are added in parentheses in order to clarify the relationship between the description of the scope of claims and the description of embodiments of the present invention. However, the numbers and symbols should not be used in the interpretation of the technical scope described in the claims of the present invention.

A data driver according to the present invention includes a delay unit (88) and a plurality of output circuits (3-1 to 3-960). The delay unit (88) sequentially delays the control signal (CTR) and outputs a plurality of delay control signals (large delay CTR to small delay CTR). Each of the output circuits (3-1 to 3-960) start outputting in response to a corresponding delay control signal of the delay control signals (large delay CTR to small delay CTR). The delay unit (88) generates delay control signals (large delay CTR to small delay CTR) to be output to the output circuits (3-1 to 960), respectively, so that the time difference between the output start time when the output circuit (3-1, 3-960), which is coupled to the line with a relatively large load capacitance of the output circuits (3-1 to 960), outputs the output voltage, and the output start time when the following or previous output circuit (3-2, 3-959) outputs the output voltage, is greater than the time difference between the output start time when the output circuit (3-480, 3-481), which is coupled to the line with a relatively small load capacitance of the output circuits (3-1 to 960), outputs the output voltage, and the output start time when the following or previous output circuit (3-479, 3-482) outputs the output voltage.

A display panel driving device according to the present invention includes a data driver (1) described in the above paragraph, and a package (10) that is coupled to the data driver (1) and has a plurality of lines with different load capacitances.

A display device according to the present invention includes a display panel driving device (1+10) described in the above paragraph, a gate driver (70), and a display panel (60). In the display panel (60), a data line (68) is driven by the display panel driving device and a gate line (67) is driven by the gate driver (70).

A data driver operation method according to the present invention includes the steps of: outputting a control signal (CTR); generating a plurality of delay control signals (large delay CTR to small delay CTR) to be output to a plurality of output circuits (3-1 to 3-960), respectively, so that the time difference between the output start time when the output circuit (3-1, 3-960), which is coupled to the line with a relatively large load capacitance of the output circuits (3-1 to 3-960), outputs the output voltage, and the output start time when the following or previous output circuit (3-2, 3-959) outputs the output voltage, is greater than the time difference between the output start time when the output circuit (3-480, 3-481), which is coupled to the line with a relatively small load capacitance of the output circuits (3-1 to 960), outputs the output voltage, and the output start time when the following or previous output circuit (3-479, 3-482) outputs the output voltage; and outputting the delay control signals (large delay CTR to small delay CTR) to the individual output circuits (3-1 to 3-960). Each of the output circuits (3-1 to 3-960) outputs the output voltage in response to each of the delay control signals.

According to the present invention, it is possible to reduce the current noise by reducing the current peak value and the current rise slope. In addition, it is also possible to improve the EMI characteristics.

DETAILED DESCRIPTION

Hereinafter, a data driver, a display panel driving device, and a display device will be described with reference to the accompanying drawings.

First Embodiment

Figure 8:
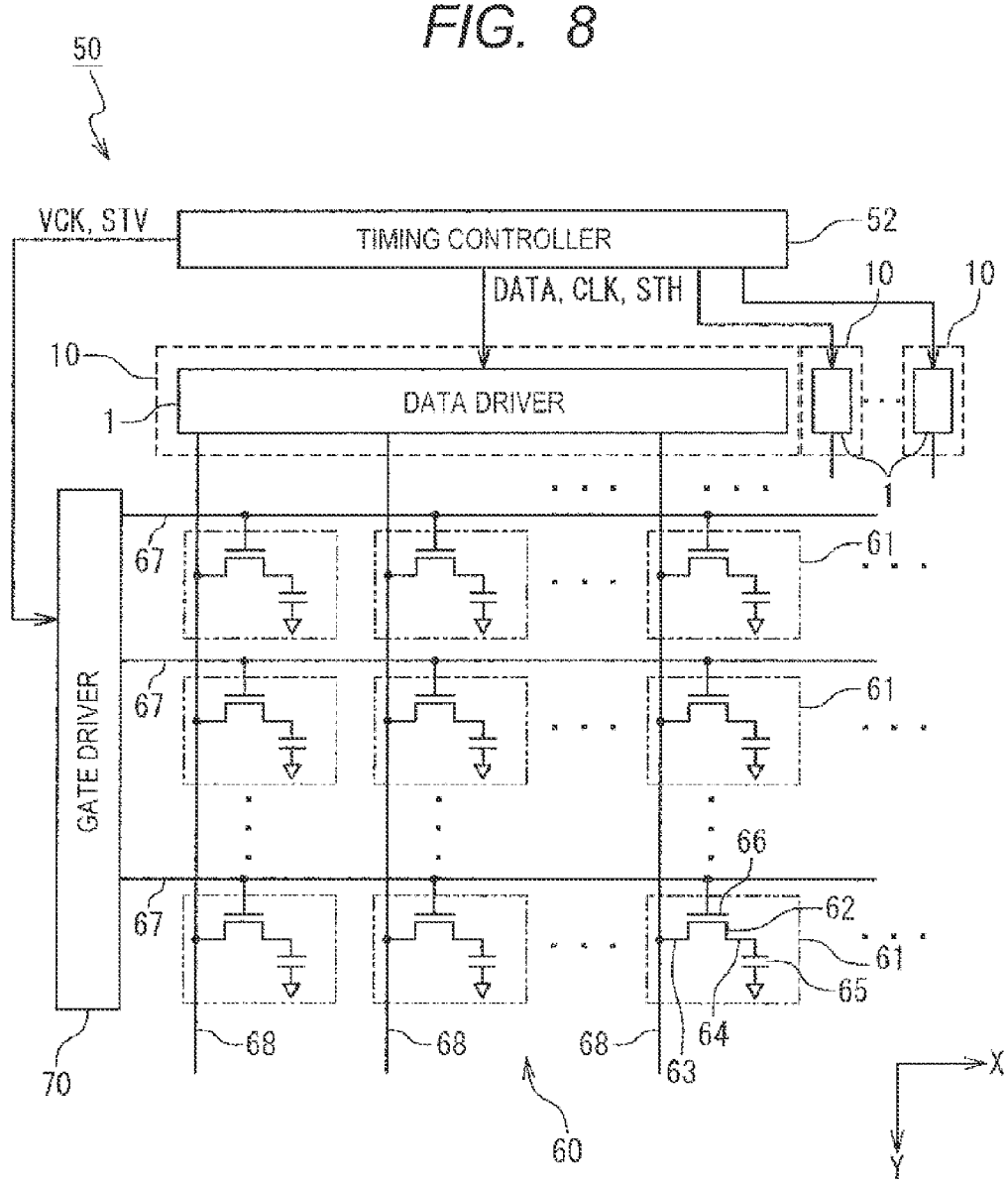
FIG. 8 is a block diagram showing an example of the configuration of a display device according to a first embodiment of the present invention.

The configuration of a display device according to a first embodiment of the present invention will be described. FIG. 8 is a block diagram showing an example of the configuration of the display device according to the first embodiment of the present invention. A display device 50 is a thin film transistor (TFT) type liquid crystal display device. The display device 50 includes a display unit (liquid crystal display panel) 60, a gate driver 70, a plurality of data drivers 1, and a timing controller 52.

The display unit (liquid crystal display panel) 60 is a liquid crystal display (LCD) module. The display unit 60 includes a plurality of gate lines 67, a plurality of data lines 68, and a plurality of pixels 61. The gate lines 67 extend in the X direction. The data lines 68 extend in the Y direction. The pixels 61 are arranged in a matrix corresponding to the points where the gate lines 67 and the data lines 68 intersect. The pixel 61 includes a thin film transistor (TFT) 62 and a pixel capacitance 65. The pixel capacitance 65 includes a pixel electrode and a counter electrode placed opposite the pixel electrode. The TFT 62 includes a drain electrode 63 coupled to the data line 68, a source electrode 64 coupled to the pixel electrode, and a gate electrode 66 coupled to the gate line 67.

The gate driver 70 drives the pixels 61 in cooperation with the data drivers 1. The gate driver 70 is provided on a chip (not shown). The gate driver 70 is coupled to the gate lines 67. The gate driver 70 drives the gate lines 67 based on a signal from a timing controller 52. The data drivers 1 drive the pixels 61 in cooperation with the gate driver 70. The data driver 1 is provided on the chip (not shown). The data driver 1 is mounted on a package 10 (described below). The data driver 1 is coupled to the data lines 68. The data driver 1 drives the data lines 68 based on the signal from the timing controller 52.

The timing controller 52 controls the data driver 70 and the data drivers 1 by signals supplied through lines. The timing controller 52 is provided on the chip (not shown). The timing controller 52 outputs a vertical clock signal VCK in one horizontal period to the gate driver 70. The timing controller 52 also outputs a vertical shift pulse signal STV to the gate driver 70 to select the gate lines 67 in order from the first to the last line. For example, the gate driver 70 selects one of the gate lines 67, according to the vertical shift pulse signal STV and the vertical clock signal VCK. In this case, the gate driver 70 outputs the selected signal to one gate line 67. The selected signal is supplied to the gate electrode 66 of the TFT 62 of the pixel 61 for one line corresponding to the particular gate line 67. Then, the TFT 62 is turned on by the selected signal. This is the same for the other gate lines 67.

The timing controller 52 outputs display data DATA for one screen (one frame), a clock signal CLK, and a shift pulse signal STH to the data driver 1. The display data DATA for one screen includes the display data from first line to the last line. The display data for one line includes a plurality of display data pieces corresponding to the individual data lines 68. The data driver 1 outputs the display data to the respective data lines 68 in response to the shift pulse signal STH and the clock signal CLK. At this time, the TFT 62 of the pixel 61 corresponding to one of the gate lines 67 and to the data lines 68 is turned on. Thus, the display data is written in the pixel capacitance 65 of the pixel 61 and held until the next writing. In this way, the display data DATA for one line is displayed.

Figure 9:
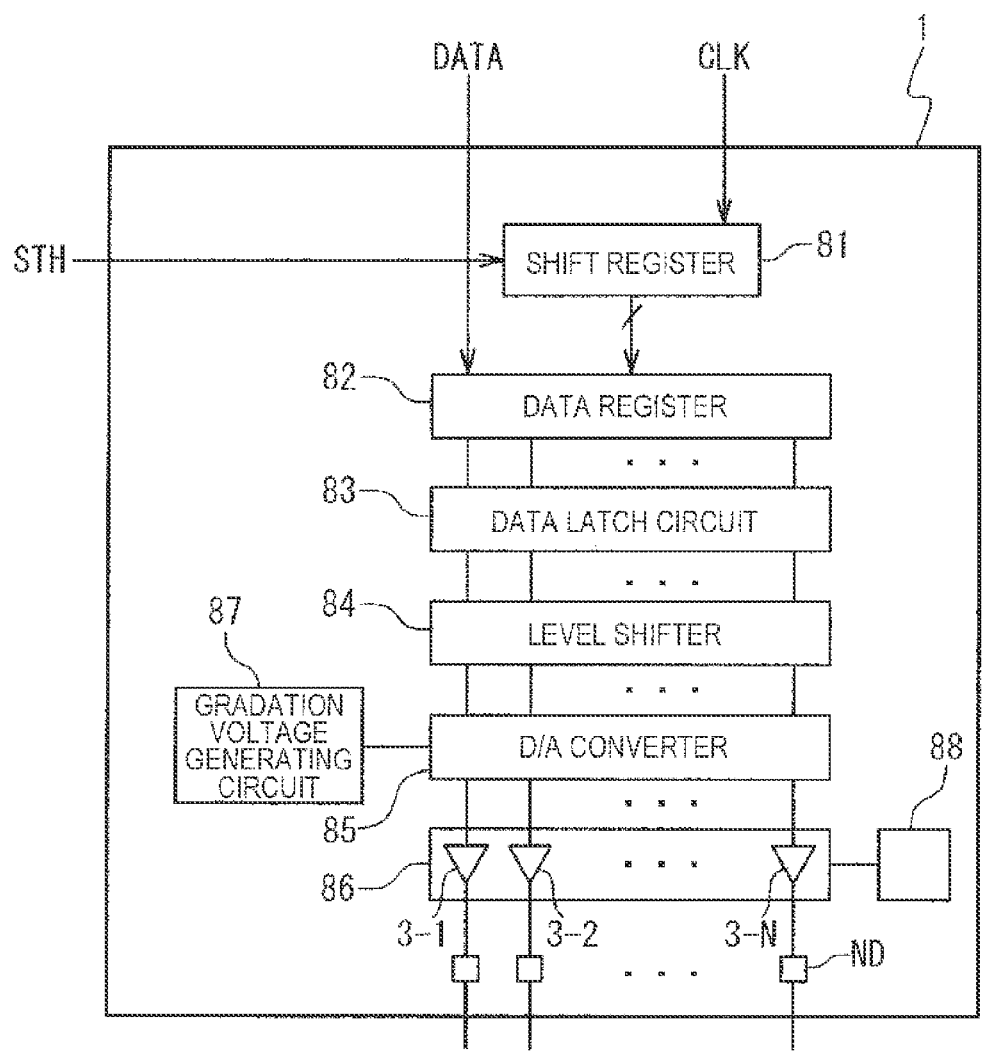
FIG. 9 is a block diagram of a data driver in FIG. 8.

FIG. 9 is a block diagram of the data driver shown in FIG. 8. The data driver 1 includes a shift register 81, a data register 82, a data latch circuit 83, a level shifter 84, a D/A converter 85, an amplifier circuit (output circuit) 86, a gradation voltage generating circuit 87, the amplifier circuit drive unit 88, and a plurality of output nodes ND. The output nodes ND are coupled to the data lines 68, respectively, through the signal lines 12 (described below) on the package 10.

The gradation voltage generating circuit 87 includes serially coupled gradation resistance elements. The gradation voltage generating circuit 87 divides the reference voltage output from a power supply circuit (not shown), by the gradation resistance elements to generate a plurality of gradation voltages. The gradation voltage generating circuit 87 outputs the generated gradation voltages to the D/A converter 85.

The shift register 81 sequentially shifts the shift pulse signal STH by synchronizing it with the clock signal CLK, and outputs to the data register 82. The data register 82 takes the individual display data DATA from the timing controller 52, coincident with the shift pulse signal STH output from the shift register 81. When the data of the data register 82 for one line is taken, the data register 82 outputs the data to the data latch circuit 83. The data latch circuit 83 includes a plurality of latch circuits. The respective latch circuits latch the display data at the same time and output to the level shifter 84. The level shifter 84 includes a plurality of level shifters. Each of the level shifters performs level conversion of the display data from the data latch circuit 83, and outputs the data to the D/A converter 85. The D/A converter 85 includes a plurality of D/A converters. Each of the D/A converters performs digital-analog conversion of the display data output from the level shifter 84. In other words, the D/A converter selects the output gradation voltage corresponding to the display data from a plurality of gradation voltages, and outputs to the amplifier circuit 86.

The amplifier circuit (output circuit) 86 includes a plurality of amplifier circuits (output circuits) 3-1 to 3-N, which are referred to as an amplifier circuit 3 when the individual amplifier circuit are not distinguished from each other. The output of the amplifier circuit 3 are coupled to the data line 68 through the output node ND and the signal line 12 (see FIG. 10) on the package 10 (see FIG. 10). The output of one amplifier circuit 3 corresponds to one output node ND, one signal line 12, and one data line 68. The amplifier circuit drive unit 88 outputs a control signal for controlling the amplifier circuit 3. The amplifier circuit 3 outputs an output gradation voltage (output voltage) to the data line 68 in response to the control signal.

Figure 10:
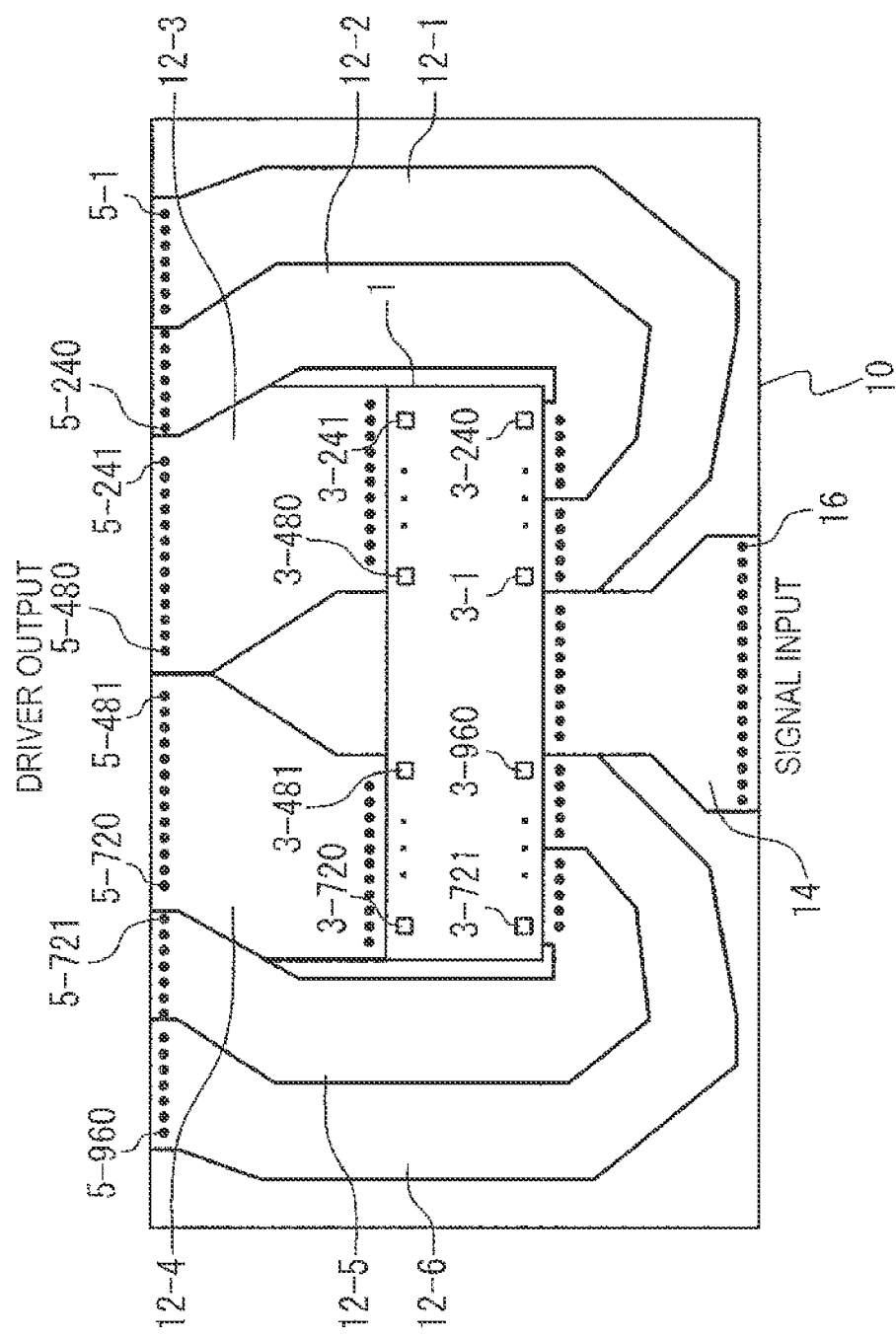
FIG. 10 is a schematic diagram showing an example of the configuration of a display panel driving device with a data driver mounted on a film carrier package according to the first embodiment of the present invention.

FIG. 10 is a schematic diagram showing an example of the configuration of a display panel driving device with the data driver 1 mounted on the film carrier type package 10 according to the first embodiment of the present invention. In the following description, it is assumed that the number of outputs of the data driver 1 is 960, namely, the number of amplifier circuits 3 is 960 (N=960). The display panel driving device includes the data driver 1 and the tape shaped package 10.

The data driver 1 is mounted on the package 10. In the example of this figure, it is shown the so-called semi-slim layout as the chip layout of the data driver 1 in which the number of outputs is 960 and output terminals are provided in the vicinity of the two long sides of the chip. The data driver 1 includes the amplifier circuit (output circuit) 3. The amplifier circuit 3 includes four groups of amplifier circuits with 240 outputs each in the lower part and the upper part on the right side of the figure and in the upper part and the lower part on the left side of the figure, according to the location of the amplifier circuit 3 in the data driver 1. In other words, the amplifier circuit 3 includes the lower right amplifier circuit group on the right side of the figure (the amplifier circuits 3-1 to 3-240), the upper right amplifier circuit group on the right side of the figure (the amplifier circuits 3-241 to 3-480), the upper left amplifier circuit group on the left side of the figure (the amplifier circuits 3-481 to 3-720), and the lower left amplifier circuit group on the left side of the figure (the amplifier circuits 3-721 to 3-960). Thus, the number of amplifier circuits 3 is 960 in total.

The package 10 includes an input signal line 14 and (output) signal line 12. The input signal line 14 is a line for the control signal (for example, display data DATA, clock signal CLK, and shift pulse signal STH) supplied from the timing controller 52, and for the power supply input. The example of this figure uses a line on a tape with an input node 16. The signal line 12 is a line for the output gradation voltage to be output to the data line 68. The example of this figure uses six lines, namely, a signal line 12-1 for the amplifier circuits 3-1 to 3-120, a signal line 12-2 for the amplifier circuits 3-121 to 3-240, a signal line 12-3 for the amplifier circuits 3-241 to 3-480, a signal line 12-4 for the amplifier circuits 3-481 to 3-720, a signal line 12-5 for the amplifier circuits 3-721 to 3-840, and a signal line 12-6 for the amplifier circuits 3-841 to 3-960. The signal lines 12-1, 12-2, 12-3, 12-4, 12-5, and 12-6 are provided with output nodes 5-1 to 5-120, 5-121 to 5-240, 5-241 to 5-480, 5-481 to 5-720, 5-721 to 5-840, and 5-841 to 5-960, respectively. The outputs of the amplifier circuits 3-1 to 3-960 are coupled to the data lines 68 of the liquid crystal display panel coupled to the nodes 5-1 to 5-960 through the signal lines 12-1 to 12-6.

In the case of the package layout shown in FIG. 10, the signal line 12 gradually increases from the signal line 12 of each amplifier circuit 3-240, 3-721 (the signal line 12 coupled to each node 5-240, 5-721) in the range of the amplifier circuits 3-1 to 3-240 and 3-721 to 3-960, in which the signal line 12 of each amplifier circuit 3-1, 3-960 (the signal line 12 of each node 5-1, 5-960) is the longest. On the other hand, the length of the signal line 12 is substantially constant in the range of the amplifier circuits 3-241 to 3-480 and 3-481 to 3-720, and is shorter than the length of the signal line 12 in the range of the amplifier circuits 3-1 to 3-240 and 3-721 to 3-960. In other words, the signal line 12 close to the input signal line 14 in the lower right amplifier circuit group and in the lower left amplitude circuit group is long, while the further the signal line 12 is separated from the input signal line 14 the shorter the length of the signal line 12 is.

Thus, the (line) load capacitance of the signal line 12 close to the input signal line 14 in the lower right amplifier circuit group and in the lower left amplifier circuit group is large, while the (line) load capacitance of the signal line 12 decreases as it is separated from the input signal line 14. Further, the (line) load capacitance of the signal line 12 is substantially the same in the upper right amplifier circuit group and in the upper left amplifier circuit group, and is smaller than the (line) load capacitance of the signal line 12 for the lower right amplifier circuit group and for the lower left amplifier circuit group. In other words, the (line) load capacitance of the signal line 12 coupled to the amplifier circuits 3-1 to 3-120, 3-960 to 3-841 is relatively large. The (line) load capacitance of the signal line 12 coupled to the amplifier circuits 3-121 to 3-240, 3-840 to 3-721 is relatively medium. Then, the (line) load capacitance of the signal line 12 coupled to the amplifier circuits 3-241 to 3-480, 3-720 to 3-481 is relatively small.

Figure 11:
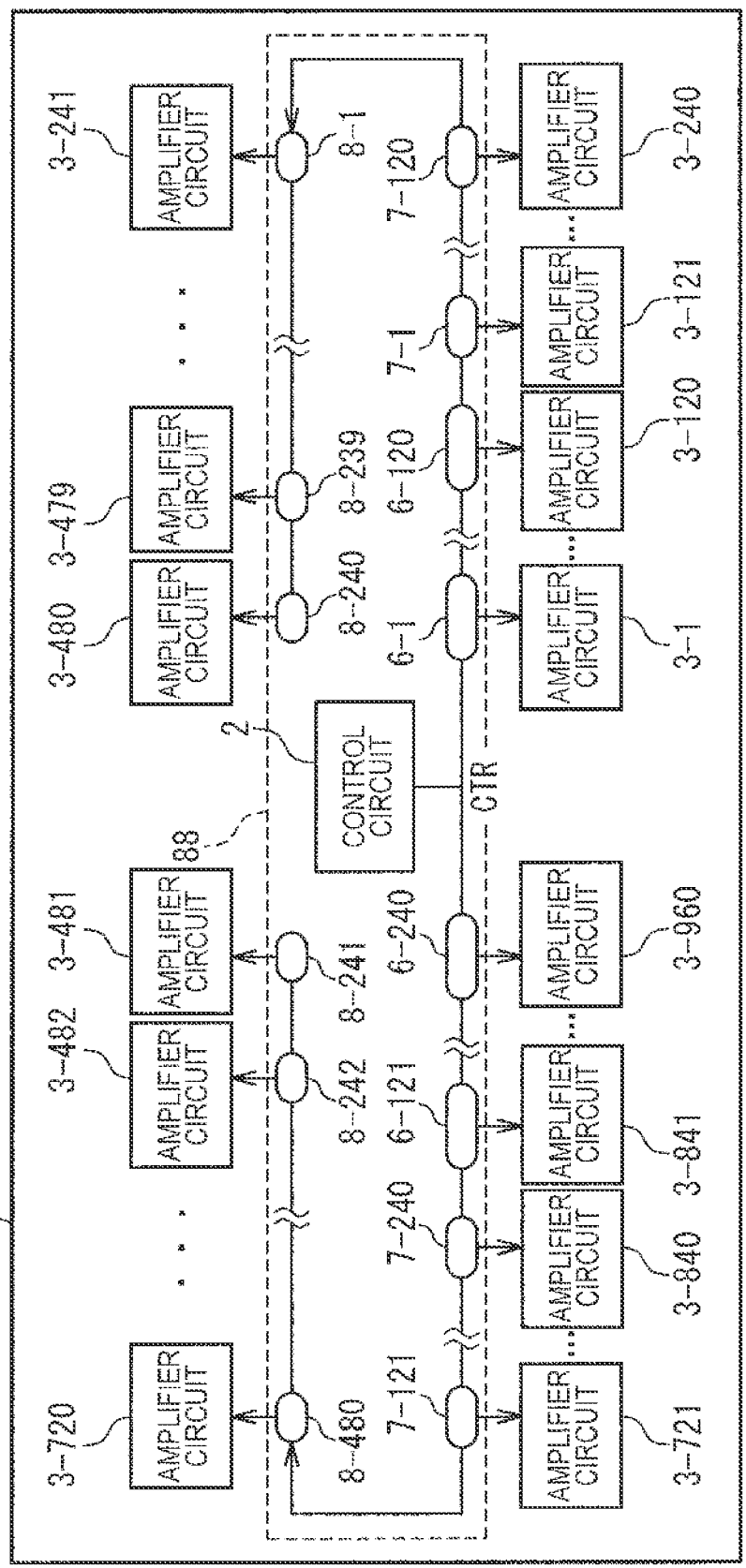
FIG. 11 is a block diagram showing an example of the configuration of the data driver according to the first embodiment of the present invention.

FIG. 11 is a block diagram showing an example of the configuration of the data driver according to the first embodiment of the present invention. In the example of this figure, as described above, it is shown the so-called semi-slim layout as the chip layout. Note that the shift register 81, the data register 82, the data latch circuit 83, the level shifter 84, the D/A converter 85, the gradation voltage generating circuit 87, and the output nodes ND are omitted in this figure.

The amplifier circuit drive unit 88 of the data driver 1 includes a control circuit 2 and delay circuits 6, 7, and 8. The amplifier circuit 86 (not shown) of the data driver 1 includes the amplifier circuit 3 (3-1 to 3-960).

The control circuit 2 outputs an amplifier drive signal (control signal) CTR to the delay circuits 6, 7, and 8 in order to drive the amplifier circuit 3. However, the control circuit 2 may not be provided within the data driver 1. In such a case, the control circuit 2 outputs the amplifier drive signal (control signal) CTR to the delay circuits 6, 7, and 8 from the outside of the amplifier circuit drive unit 88 (for example, from the timing controller 52).

The delay circuit (6, 7, 8) is provided corresponding to the amplifier circuit 3. In other words, one delay circuit corresponds to one amplifier circuit 3. In this embodiment, the delay time is divided into 3 time periods, according to the length (the magnitude of the load capacitance) of the signal line 12 coupled to the corresponding amplifier circuit 3. Then, the delay circuit is divided into 3 groups, namely, the three delay circuits 6, 7, and 8 according to the three delay times. In this case, the delay time of the delay circuit 6 is the longest, the delay time of the delay circuit 8 is the shortest, and the delay time of the delay circuit 7 is medium. Then, the delay circuit 6 with the longest delay time is coupled to the amplifier circuit 3 in which the signal line 12 to be coupled is long (the load capacitance is large). The delay circuit 7 with the medium delay time is coupled to the amplifier circuit 3 in which the signal line 12 to be coupled is medium (the load capacitance is medium). The delay circuit 8 with the shortest delay time is coupled to the amplifier circuit 3 in which the signal line 12 to be coupled is short (the load capacitance is small). Note that the number of groups is not limited to three.

More specifically, the delay circuits 6-1 to 6-120, 6-121 to 6-240 with the long delay time are coupled to the amplifier circuits 3-1 to 3-120, 3-841 to 3-960 in which the signal line 12 to be coupled is long. The amplifier drive signal CTR is sequentially transmitted with a timing significantly delayed by the delay circuit 6. The delay circuits 8-1 to 8-480 with the short delay time are coupled to the amplifier circuits 3-241 to 3-720 in which the signal line 12 to be coupled is short. The amplifier drive signal CTR is sequentially transmitted with a timing slightly delayed by the delay circuit 8. Further, the delay circuits 7-1 to 7-120, 7-121 to 7-240 with the medium delay time are coupled to the amplifier circuits 3-121 to 3-240, 3-721 to 3-840 in which the signal line 12 to be coupled is medium. The amplifier drive signal CTR is sequentially transmitted with a timing moderately delayed by the delay circuit 7.

The delay circuit 6-1 to the delay circuit 6-120, the delay circuit 7-1 to the delay circuit 7-120, and the delay circuit 8-1 to the delay circuit 8-240 are coupled to the control circuit 2 in series in this order. Further, the delay circuit 6-240 to the delay circuit 6-121, the delay circuit 7-240 to the delay circuit 7-121, and the delay circuit 8-480 to the delay circuit 8-241 are coupled to the control circuit 2 in series in this order. The two serially coupled delay circuit arrays are coupled to the control circuit 2 in parallel.

Each of the delay circuits 6-1 to 6-120, 7-1 to 7-120, and 8-1 to 8-240 outputs the control signal, which is delayed by the previous delay circuit, as the delay control signal to each corresponding one of the amplifier circuits 3-1 to 3-120, 3-121 to 3-240, and 3-241 to 3-480. Then, each of the delay circuits 6-1 to 6-120, 7-1 to 7-120, and 8-1 to 8-240 delays the control signal and outputs the delayed control signal to the following delay circuit. Similarly, each of the delay circuits 6-240 to 6-121, 7-240 to 7-121, and 8-480 to 8-241 outputs the control signal, which is delayed by the previous delay circuit, as the delay control signal to each corresponding one of the amplifier circuits 3-960 to 3-841, 3-840 to 3-721, and 3-720 to 3-481. Then, each of the delay circuits 6-240 to 6-121, 7-240 to 7-121, and 8-480 to 8-241 delays the control signal and outputs the delayed control signal to the following delay circuit.

In other words, the amplifier drive signal CTR of the control circuit 2 is sequentially delayed and transmitted from the delay circuit 6-1 to the delay circuit 6-120. Next, the amplifier drive signal CTR is sequentially delayed and transmitted from the delay circuit 7-1 to the delay circuit 7-120. Then, the amplifier drive signal CTR is sequentially delayed and transmitted from the delay circuit 8-1 to the delay circuit 8-240. At the same time, the amplifier drive signal CTR is sequentially delayed and transmitted from the delay circuit 6-240 to the delay circuit 6-121. Next, the amplifier drive signal CTR is sequentially delayed and transmitted from the delay circuit 7-240 to the delay circuit 7-121. Then, the amplifier drive signal CTR is sequentially delayed and transmitted from the delay circuit 8-480 to the delay circuit 8-241. Each delay circuit (6, 7, 8) is coupled to the corresponding amplifier circuit 3. Note that the delay circuit 142 can also be applied to this embodiment in order to provide a delay time difference between the left and right sides of the chip shown in FIG. 3.

At this time, as described above in the three groups (6-1 to 6-240: 7-1 to 7-240: 8-1 to 8-480), the delay time of the delay circuits is different in each of the three groups. Then, in the three groups, the delay time of the delay circuits 6-1 to 6-120, 6-240 to 6-121 that belong to the previous group is longer than the delay time of the delay circuits 7-1 to 7-120, 7-240 to 7-121 that belong to the following group. Similarly, the delay time of the delay circuits 7-1 to 7-120, 7-240 to 7-121 that belong to the previous group is longer than the delay time of the delay circuits 8-1 to 8-240, 8-480 to 8-241 that belong to the following group.

Further, in the delay circuits 6-1 to 6-240, 7-1 to 7-240, and 8-1 to 8-480 as a whole, the delay time of the previous delay circuit is greater than the delay time of the following delay circuit. In particular, the delay time of the previous delay circuits 6-120, 6-121 is longer than the delay time of the following delay circuits 7-1, 7-240. Similarly, the delay time of the previous delay circuits 7-120, 7-121 is longer than the delay time of the following delay circuits 8-1, 8-480.

As described above, the delay circuits 6, 7, 8 have the three groups of the delay circuits 6-1 to 6-240, 7-1 to 7-240, and 8-1 to 8-480. Thus, the delay circuits 6, 7, 8 have 960 delay circuits in total. The control circuit 2 outputs the amplifier drive signal CTR as the control signal to the delay circuits 6, 7, and 8. The delay circuits 6-1 to 6-240, 7-1 to 7-240, and 8-1 to 8-480 sequentially output the amplifier drive signal CTR to the amplifier circuits 3-1 to 3-960, to sequentially operate the amplifier circuits 3-1 to 3-960 with a desired timing. With respect to the output timing of the amplifier circuit 3, the amplifier circuits 3-1 and 3-960 output first and the amplifier circuits 3-480 and 3-481 output last.

In other words, the amplifier circuit drive unit (delay unit) 88 generates the amplifier control signal (control signal) to be output to the output circuits 3-1 to 3-960, respectively, so that the time difference between the output start time when the output circuit (e.g., 3-1, 3-960), which is coupled to the line with a relatively large load capacitance of the output circuits 3-1 to 3-960, starts outputting, and the output start time when the following or previous output circuit (e.g., 3-2, 3-959) starts outputting, is greater than the time difference between the output start time when the output circuit (e.g., 3-480, 3-481), which is coupled to the line with a relatively small load capacitance of the output circuits 3-1 to 960, starts outputting, and the output start time when the following or previous output circuit (e.g., 3-479, 3-482) starts outputting. Then, a plurality of generated amplifier drive signals (control signals) CTR are output to the amplifier circuits 3-1 to 3-960, respectively. Here, the previous or following amplifier circuit means the amplifier circuit (or amplifier circuit group) before or after the base amplifier circuit in an electrical coupling relationship. In this case, the amplifier circuit before the base amplifier circuit is first operated, the base amplifier circuit is operated next, and then the amplifier circuit after the base amplifier circuit is operated. However, these amplifier circuits are not necessarily next to each other in the positional relationship.

Figure 1:
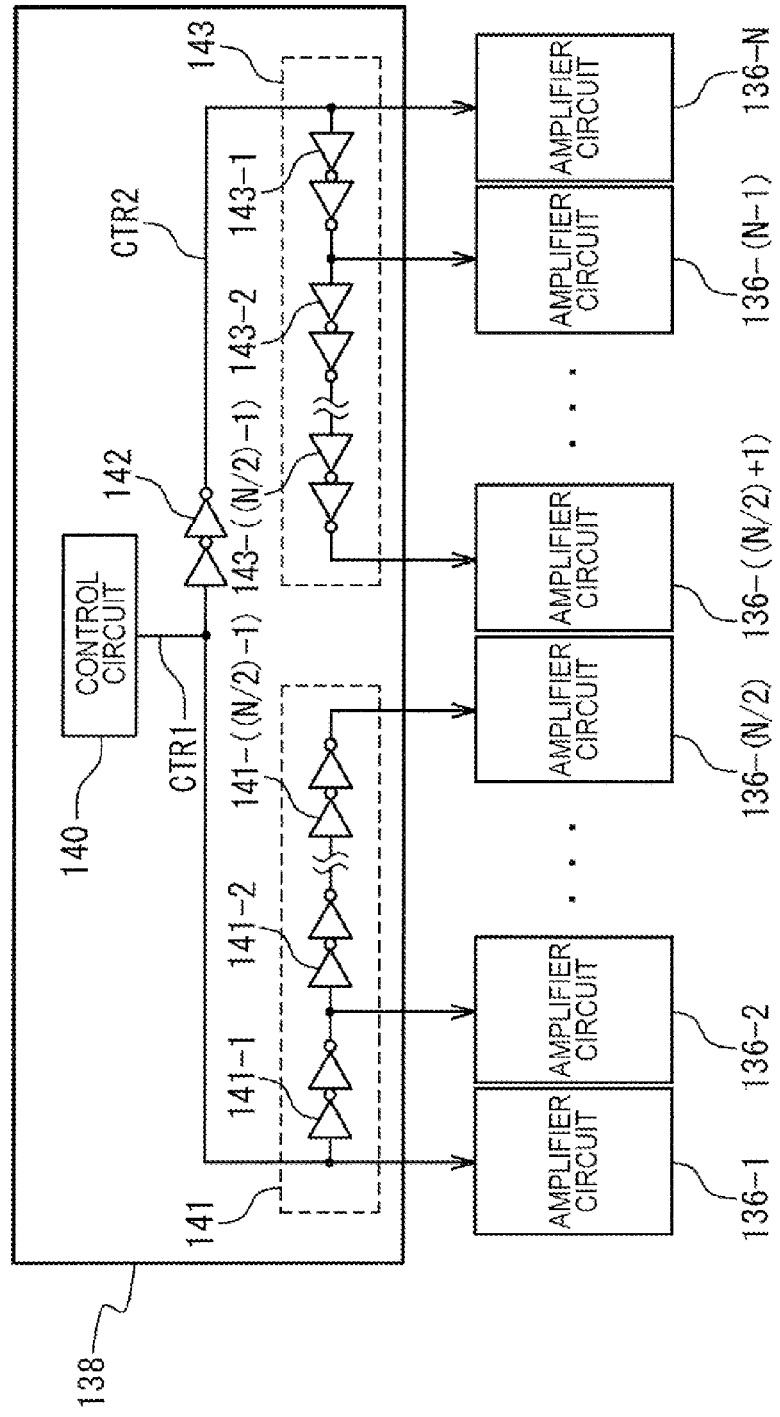
FIG. 1 is a block diagram of a driver disclosed in Japanese Unexamined Patent Publication No. 2010-176083.
Figure 2:
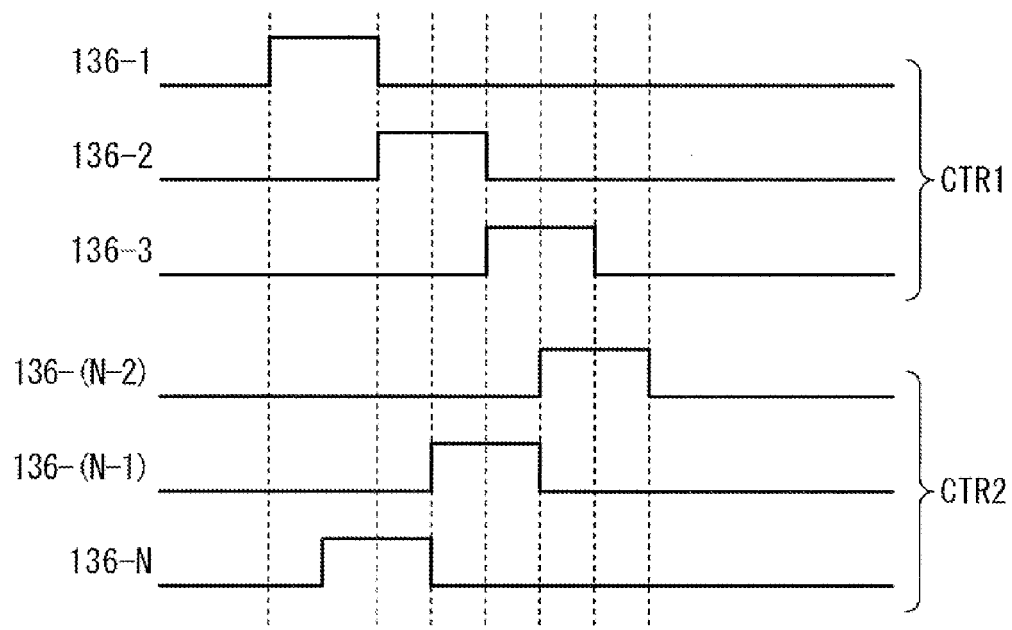
FIG. 2 is a timing chart showing waveforms of control signals input to amplifier circuits from an amplifier circuit drive unit in Japanese Unexamined Patent Publication No. 2010-176083.
Figure 3:
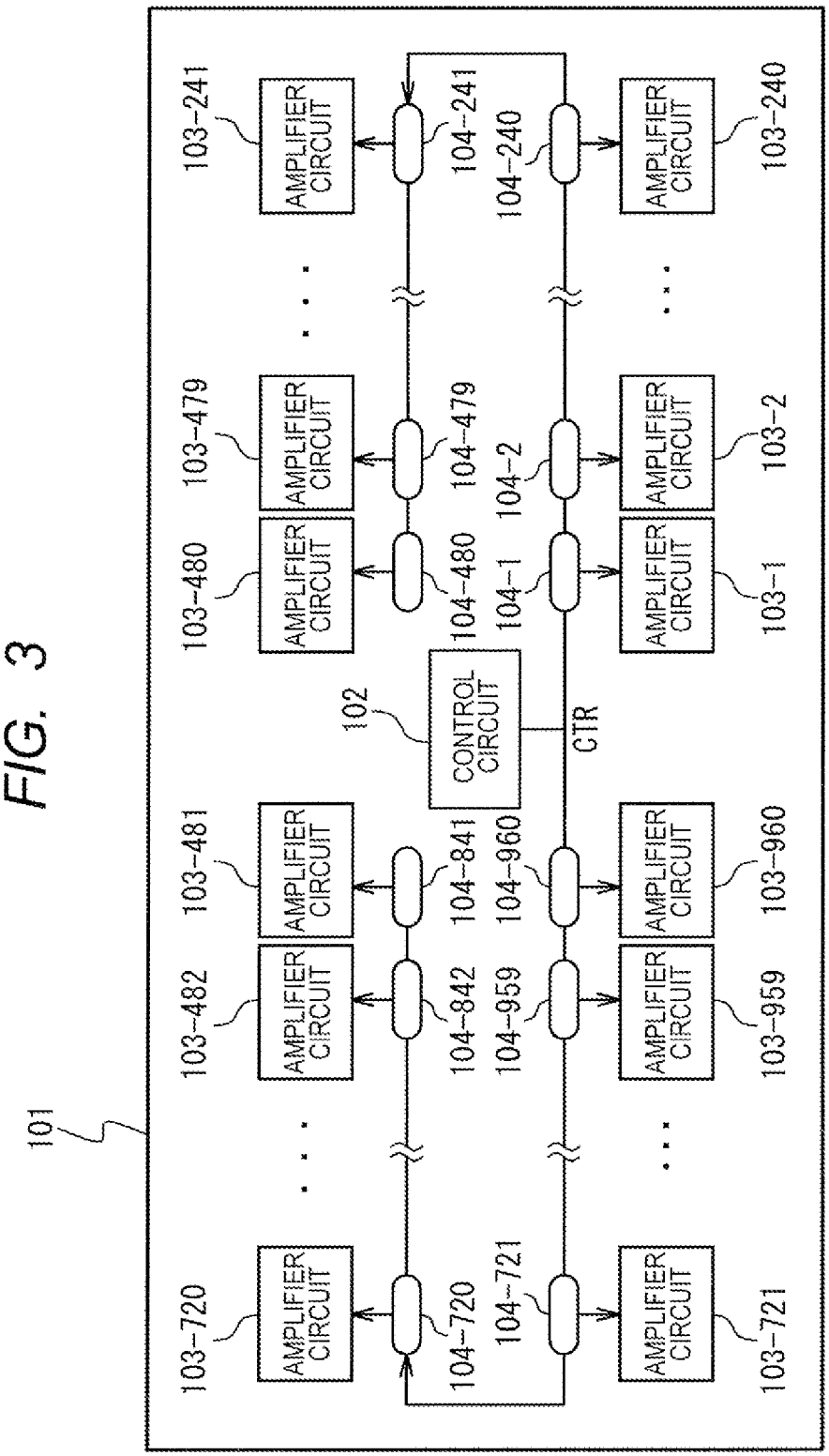
FIG. 3 is a schematic diagram showing an example of the configuration of a typical data driver.
Figure 4:
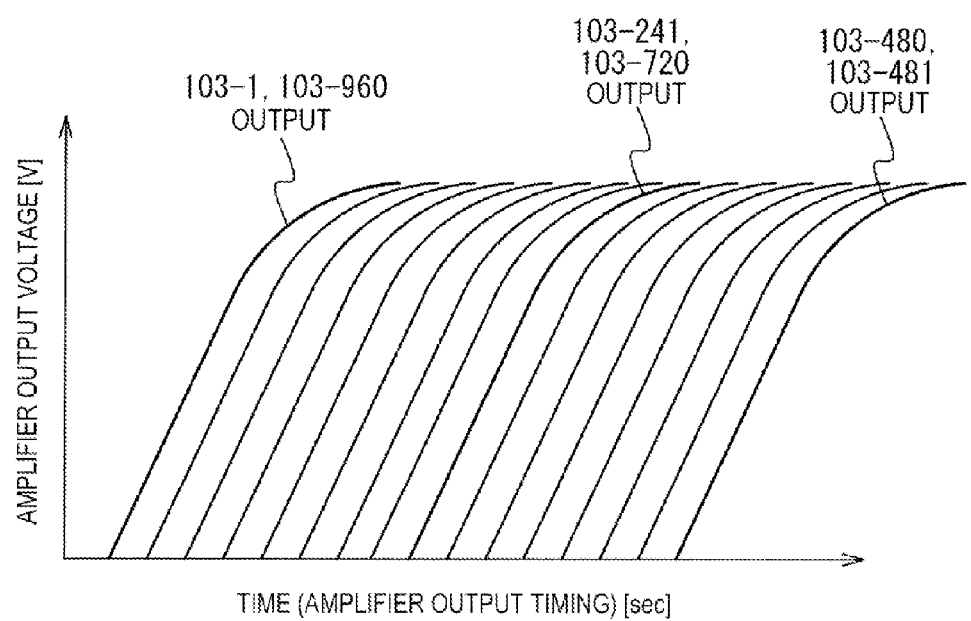
FIG. 4 is a graph schematically showing an example of the waveform of the output voltage of each amplifier circuit in FIG. 3.
Figure 5:
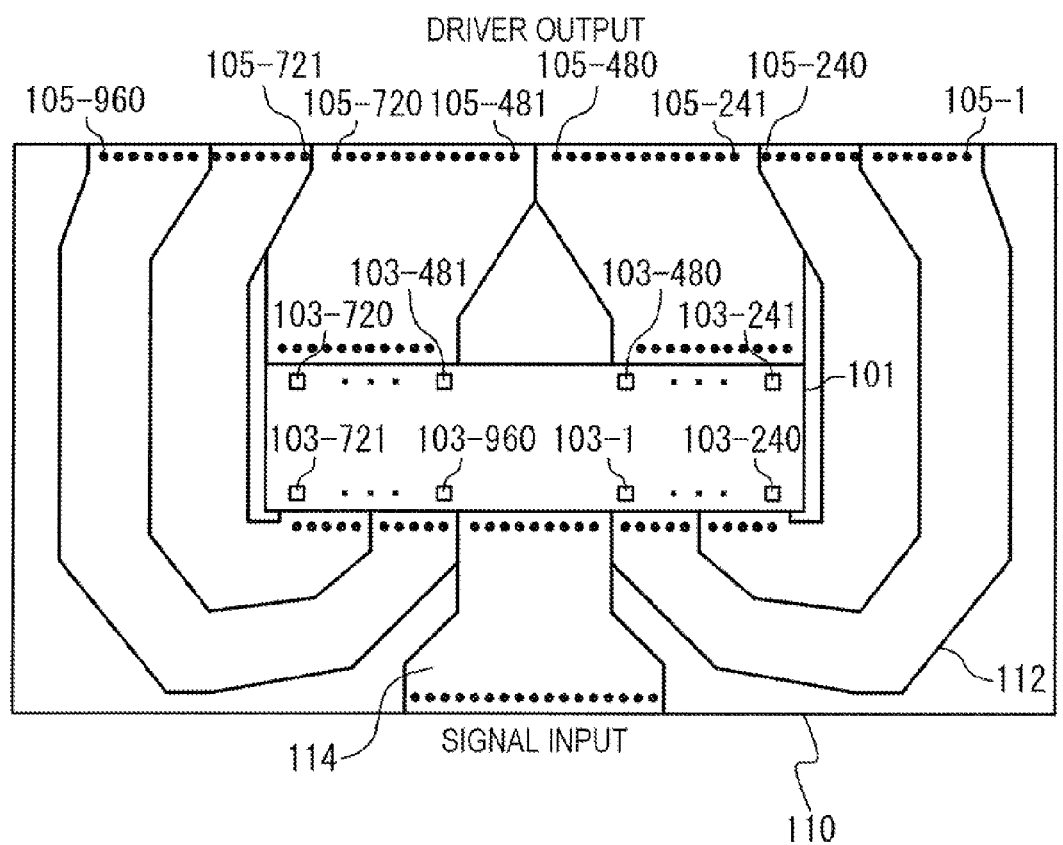
FIG. 5 is a schematic diagram showing an example of the configuration of a display panel driving device with a data driver mounted on a typical film carrier package.

Other configurations are the same as those in FIG. 3.

Figure 12A:
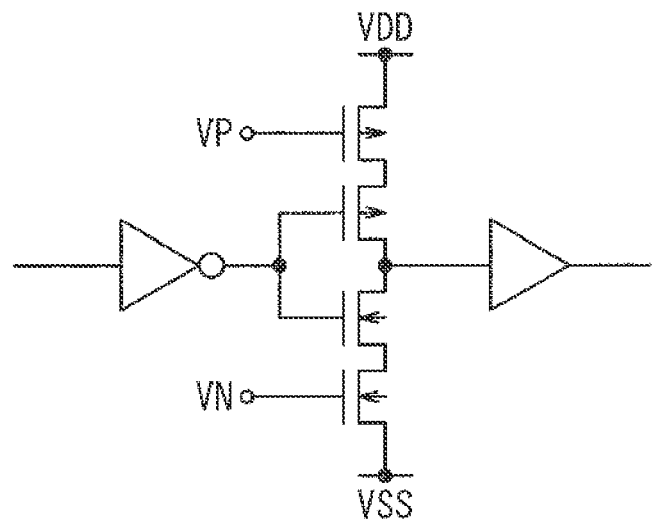
FIG. 12A is a circuit diagram showing a specific example of a delay circuit according to the first embodiment of the present invention.
Figure 12B:
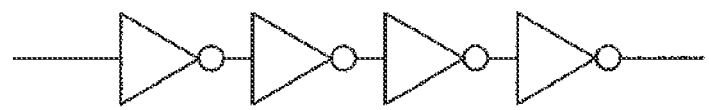
FIG. 12B is a circuit diagram showing another specific example of the delay circuit according to the first embodiment of the present invention.
Figure 12C:
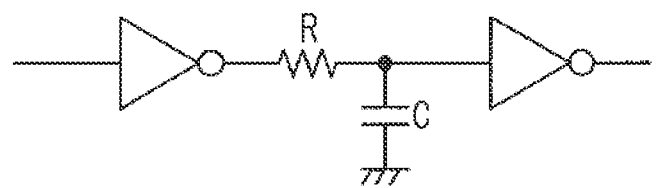
FIG. 12C is a circuit diagram showing still another specific example of the delay circuit according to the first embodiment of the present invention.

FIGS. 12A to 12C are circuit diagrams showing specific examples of the delay circuit according to the first embodiment of the present invention. The delay circuit of FIG. 12A is an analog delay circuit. In FIG. 12A, the delay circuit includes a first Pch transistor with the source coupled to a power supply VDD, a second Pch transistor with the source coupled to the drain of the first Pch transistor, a first Nch transistor with the drain coupled to the drain of the second Pch, and a second Nch transistor with the source coupled to a power supply VSS. An input (amplifier drive signal CTR) is supplied to the gates of the second Pch transistor and the first Nch transistor through an inverter. Then, an output (delayed amplifier drive signal CTR) is transmitted from the drains of the second Pch transistor and the first Nch transistor through a buffer. The delay time is adjusted by bias voltages VP, VN that are supplied to the gates of the first Pch transistor and the second Nch transistor. FIG. 12B shows a digital delay circuit. For example, logic elements such as inverters are serially coupled to adjust the delay time by the number of logic elements and the like. FIG. 12C shows a delay circuit using resistance R and capacitance C. The resistance R and the capacitance C may be separately prepared, or one or both of the two elements may be a parasitic element of the previous and following elements. However, the delay circuits (6, 7, 8, and 9 (described below)) in this embodiment are not limited to such specific examples, and other delay circuits can also be used.

Figure 13:
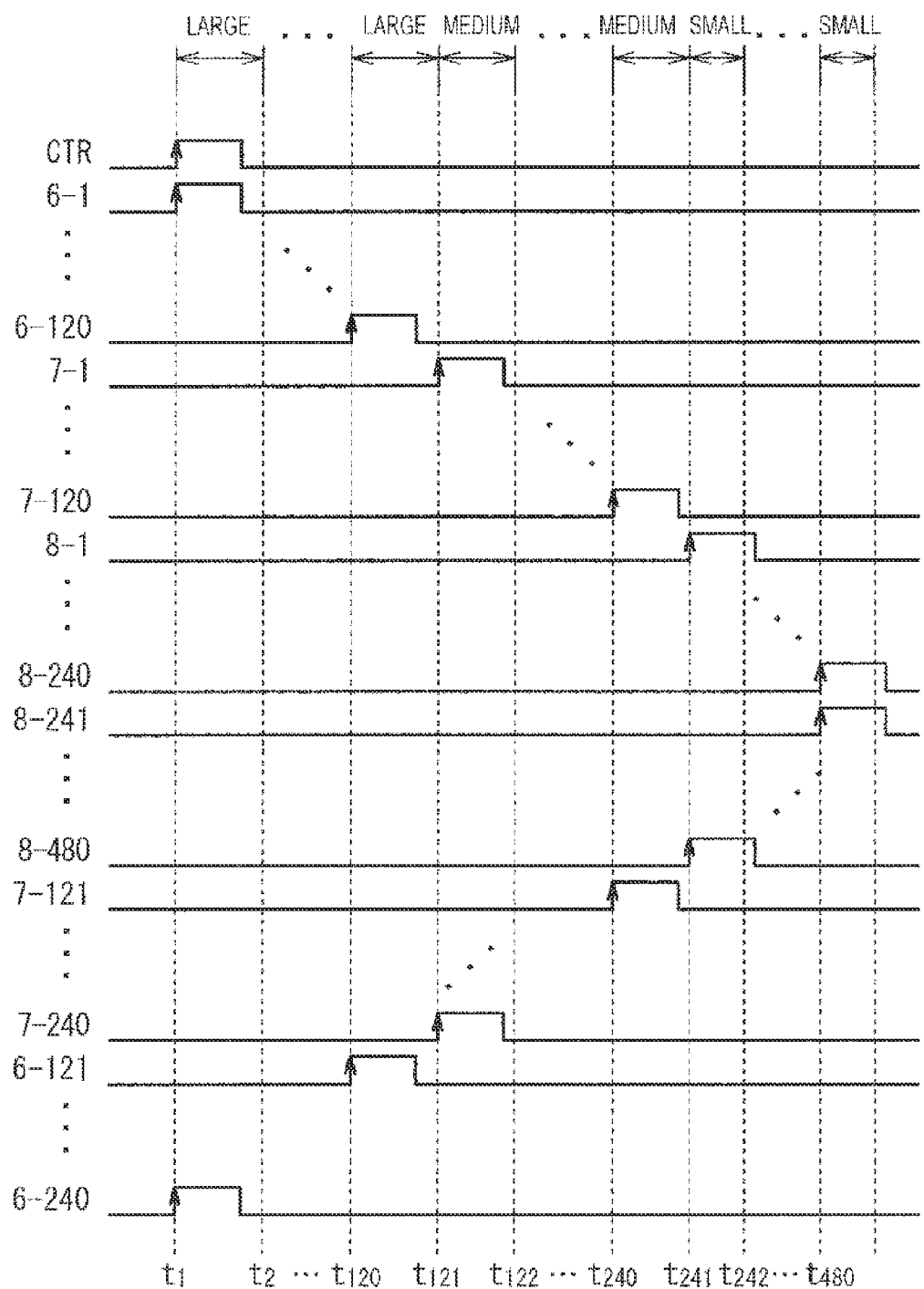
FIG. 13 is a timing chart showing operations of the data driver according to the first embodiment of the present invention.

Next, the operation of the data driver according to the first embodiment of the present invention will be described. FIG. 13 is a timing chart showing operations of the data driver according to the first embodiment of the present invention. This figure shows the output signal (amplifier drive signal CTR) of the control circuit 2 at each time, as well as the output signals (for one cycle) of the delay circuits 6-1 to 6-240, 7-1 to 7-240, and 8-1 to 8-480. The pulse width of the output signals is constant. However, the interval of the active edge (e.g., raising edge) of the output signal of each delay circuit varies depending on the delay time of the delay circuit. More specifically, the interval of the active edge of the output signal in the delay circuits 6-1 to 6-120, 6-240 to 6-121 is large (marked as "LARGE"). The interval of the active edge of the output signal in the delay circuits 7-1 to 7-120, 7-240 to 7-121 is medium (marked as "MEDIUM"). The interval of the active edge of the output signal in the delay circuits 8-1 to 8-240, 8-480 to 8-241 is small (marked as "SMALL").

At the time t1, the control circuit 2 outputs the amplifier drive signal (control signal) CTR. The amplifier drive signal CTR controls the amplifier circuit 3 so that the amplifier circuit 3 amplifies the input signal (the output gradation voltage corresponding to the display data output from the D/A converter) and outputs the amplified output signal to the output terminal in the active edge (e.g., in the change from Lo level to Hi level) of the amplifier drive signal CTR. For example, the output state of the amplifier circuit changes to another operation mode (e.g., high impedance and the like) by another control signal by the next active edge of the amplifier drive signal CTR. In dot inversion driving and line inversion driving, for example, the polarity of the output of the amplifier circuit changes for each line output according to the driving method of the display unit (liquid crystal display panel) 60. For this reason, the signal with different polarity is output in the next operation.

At the times t1 to t120, the amplifier drive signal CTR is output to the amplifier circuits 3-1 to 3-120 and 3-960 to 3-841, sequentially. At the same time, the amplifier drive signal CTR is delayed by the delay circuits 6-1 to 6-120, 6-240 to 6-121. At this time, the next output timing is significantly delayed by each of the delay circuits 6-1 to 6-120, 6-240 to 6-121. In response to the active edge of the amplifier drive signal CTR, the amplifier circuits 3-1 to 3-120 and 3-960 to 3-841 amplify the input signal (the output gradation voltage according to the display data) and output the output signal to the output terminal. Note that in this example, the amplifier drive signal CTR is just output to the amplifier circuit 3-1 and the amplifier circuit 3-960 at the time t1. However, it is of course possible to buffer the CTR, which is the output of the control circuit 2, to obtain the amplifier drive signal.

At the times t121 to t240, the amplifier drive signal CTR passing through the delay circuits 6-120, 6-121 is sequentially output to each of the amplifier circuits 3-121 to 3-240, 3-840 to 3-721. At the same time, the amplifier drive signal CTR is delayed by the delay circuits 7-1 to 7-120, 7-240 to 6-121. At this time, the next output timing is delayed to a medium level by the delay circuits 7-1 to 7-120, 7-240 to 7-121. The degree of the delay by the delay circuit 7 ("MEDIUM") is smaller than the degree of the delay by the delay circuit 6 ("LARGE"). In response to the active edge of the amplifier drive signal CTR, the amplifier circuits 3-121 to 3-240, 3-840 to 3-721 amplify the input signal (the output gradation voltage according to the display data) and output the output signal to the output terminal.

At the times t241 to t480, the amplifier drive signal CTR passing through the delay circuits 7-120, 7-121 is sequentially output to each of the amplifier circuits 3-241 to 3-480, 3-720 to 3-481. At the same time, the amplifier drive signal CTR is delayed by the delay circuits 8-1 to 8-240, 8-480 to 8-241. At this time, the next output timing is slightly delayed by the delay circuits 8-1 to 8-240, 8-480 to 8-241. The degree of the delay by the delay circuit 8 ("SMALL") is smaller than the degree of the delay by the delay circuit 6 ("LARGE"), and is smaller than the degree of the delay by the delay circuit 7 ("MEDIUM"). In response to the active edge of the amplifier drive signal CTR, the amplifier circuits 3-241 to 3-480, 3-720 to 3-481 amplify the input signal (the output gradation voltage according to the display data) and output the output signal to the output terminal.

As described above, the data driver according to the first embodiment of the present invention is operated. The output signals (the amplified output gradation voltages) of the output terminals are output to the data lines 68 through the signal lines 12, respectively.

Figure 14A:
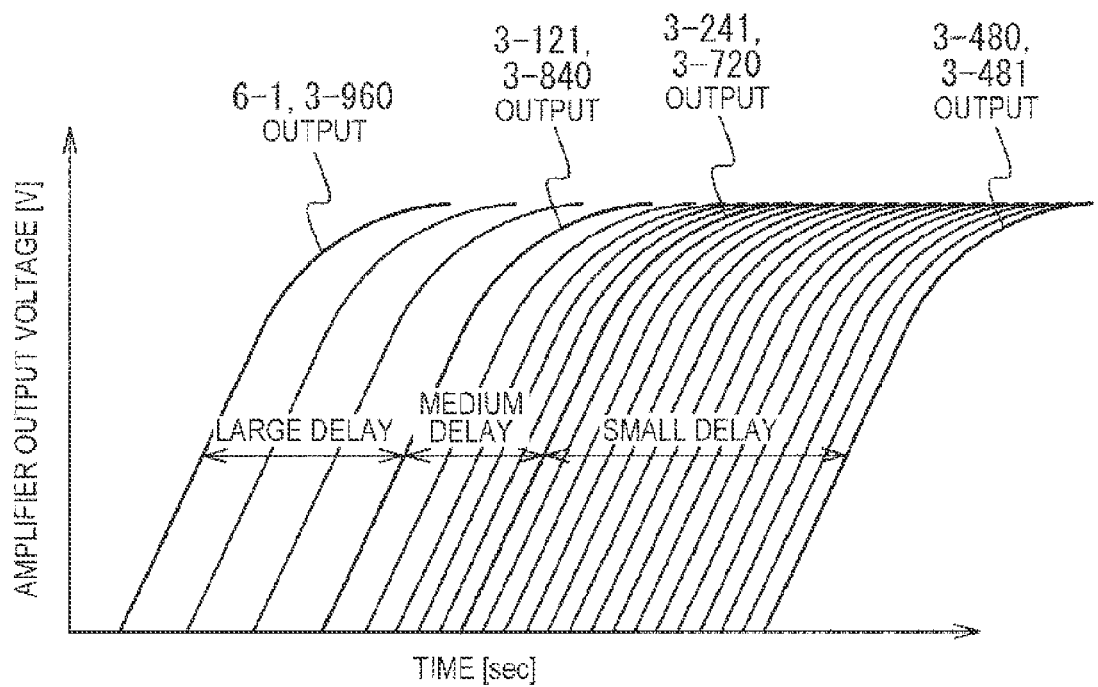
FIG. 14A is a graph schematically showing an example of the waveform of the output voltage of each amplifier circuit shown in FIG. 11.

FIG. 14A is a graph schematically showing an example of the waveform of the output voltage of each amplifier circuit shown in FIG. 11. The vertical axis represents the output voltage (V) of the amplifier circuit, and the horizontal axis represents the time (output timing: seconds). With respect to the output voltage from the amplifier circuits 3-1 to 3-120 and 3-960 to 3-841, each output voltage rises with a long time interval because the delay time of the delay circuit 6 is long (marked as LARGE DELAY in the figure). With respect to the output voltage from the amplifier circuits 3-121 to 3-240 and 3-840 to 3-721, each output voltage rises with a medium time interval because the delay time of the delay circuit 7 is medium (marked as MEDIUM DELAY in the figure). With respect to the output voltage from the amplifier circuits 3-241 to 3-480 and 3-720 to 3-481, each output voltage rises with a short time interval because the delay time of the delay circuit 8 is short (marked as SMALL DELAY in the figure). In other words, the amplifier circuits 3-1 to 3-120, 3-960 to 3-841 output the voltage specified by the uniformly long time difference in these amplifier circuit groups. The amplifier circuits 3-121 to 3-240, 3-840 to 3-721 output the voltage specified by the uniformly medium time difference in these amplifier circuit groups. The amplifier circuits 3-241 to 3-480, 3-720 to 3-481 output the voltage specified by the uniformly short time difference in these amplifier circuit groups.

Figure 6:
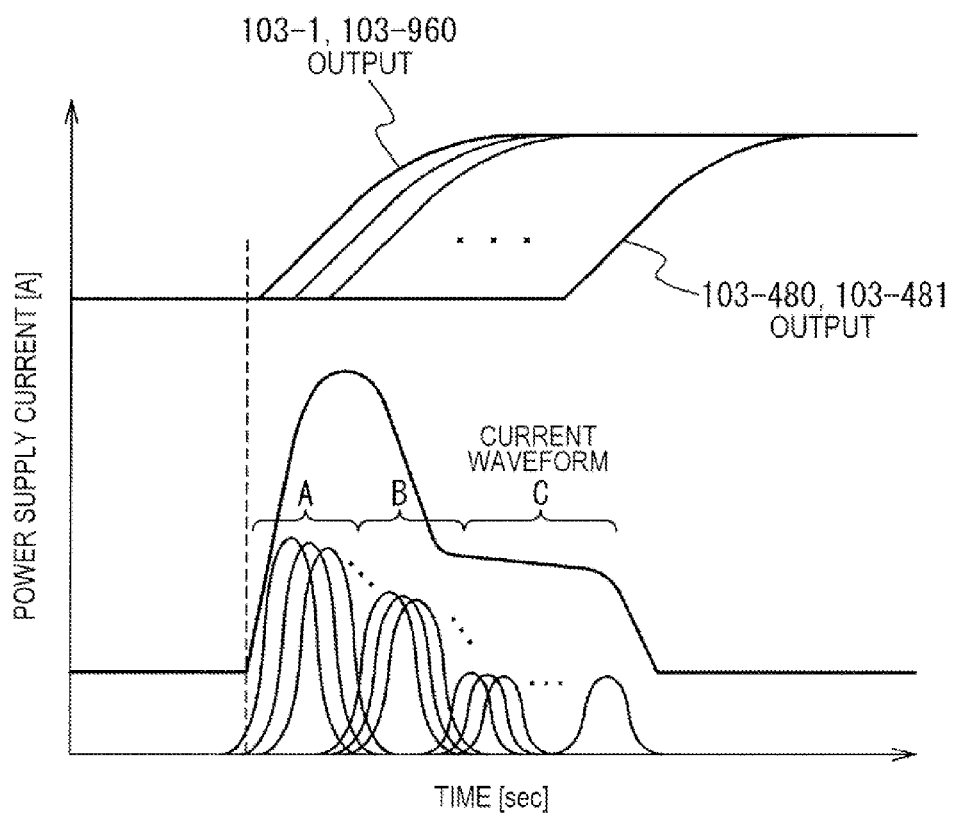
FIG. 6 is a graph schematically showing an example of the waveform of the power supply current of the data driver in FIG. 5, together with an example of the waveform of the output voltage of each amplifier circuit.
Figure 7:
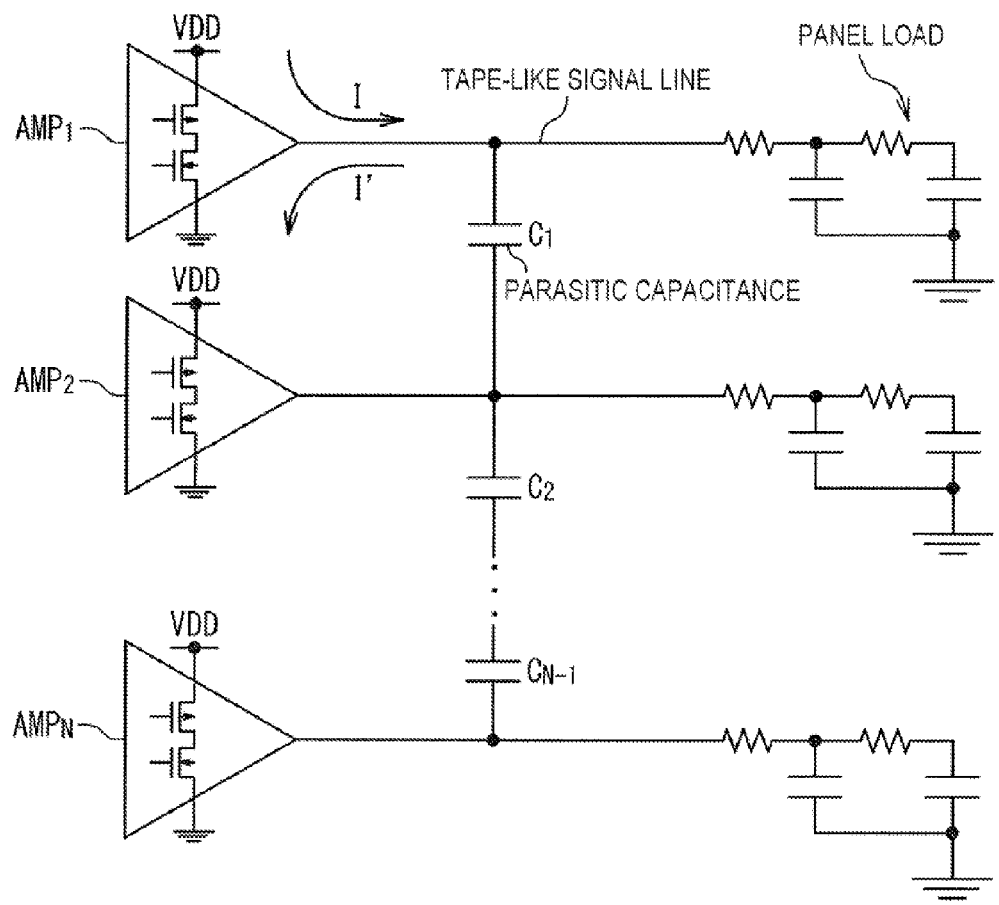
FIG. 7 is a schematic diagram of the parasitic capacitance of signal lines coupled to the amplifier circuits.
Figure 14B:
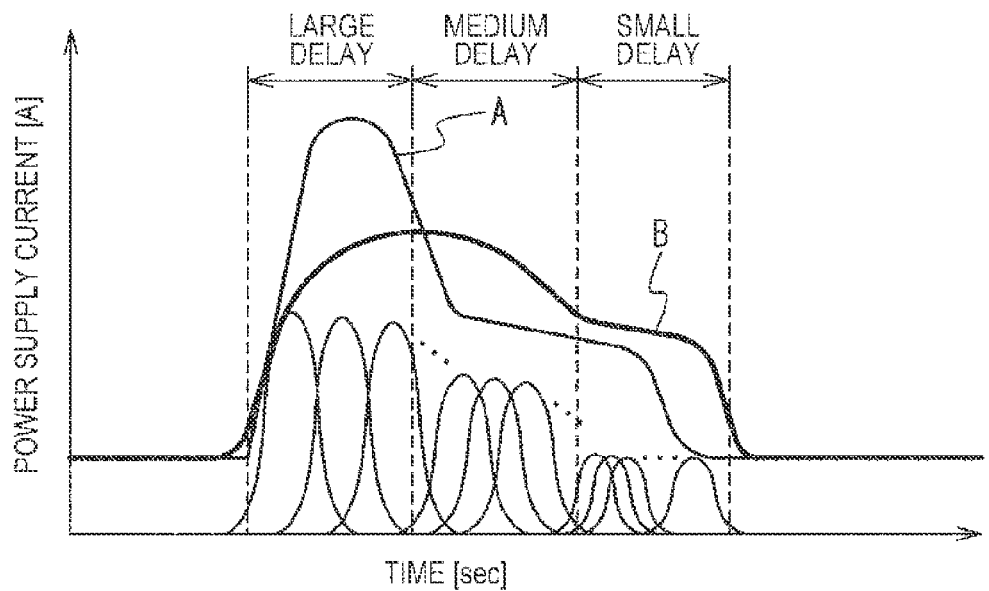
FIG. 14B is a graph schematically showing an example of the waveform of the power supply current of the data driver shown in FIG. 10.

FIG. 14B is a graph schematically showing an example of the waveform of the power supply current of the data driver shown in FIG. 10. The vertical axis represents the power supply current (A) and the horizontal axis represents the time (output timing: seconds). The waveform of the power supply current is an example when the output load capacitance of the display panel driving device is small, or when the line resistance of the coupled data line is large. "LARGE DELAY" in the figure shows the power supply current with respect to the amplifier circuits 3-1 to 3-120 and 3-841 to 3-960. "MEDIUM DELAY" in the figure shows the power supply current with respect to the amplifier circuits 3-121 to 3-240 and 3-721 to 3-840. "SMALL DISPLAY" in the figure shows the power supply current with respect to the amplifier circuits 3-241 to 3-720. The thick line graph "A" is the power supply waveform of the thick line in FIG. 6 (shown again). The thick line graph "B" is the graph in which a plurality of power supply currents of "LARGE DELAY", a plurality of power supply currents of "MEDIUM DELAY", and a plurality of power supply currents of "SMALL DELAY" are overlapped. The case "A" and the case "B" are the same in the configuration, except the configuration of the delay circuit. Note that, for ease of understanding, FIG. 14B schematically shows the general waveform of the power supply current for each output of the amplifier circuit 3.

In the case "A" (the thick line power supply waveform shown in FIG. 6), all the outputs of the amplifier circuit 103 are delayed with a uniform timing. Thus, the power supply current concentrates on the first part of the current waveform in which the signal line 112 is long and the load is large, so that the current peak is high. Further, the rising slope of the power supply current (dI/dt) also increases accordingly. On the other hand, in the case "B" (the current waveform in this embodiment), the magnitude of the delay time is controlled according to the magnitude of the load of the signal line 12. Thus, the power supply current is distributed, so that the current peak can be reduced and the current rise slope (dI/dt) can be reduced.

This will be described in more detail below. In the group of the amplifier circuit 3 indicated by "LARGE DELAY" in FIG. 14B, similarly to the group indicated by the range A in FIG. 6, the signal line 12 is relatively long and the load is relatively large. In the group of the amplifier circuit 3 indicated by "SMALL DELAY" in FIG. 14B, similarly to the group indicated by the range C in FIG. 6, the signal line 12 is relatively short and the load is relatively small. In the group of the amplifier circuit 3 indicated by "MEDIUM DELAY" in FIG. 14B, similarly to the group indicated by the range B in FIG. 6, the length of the signal line 12 is medium. Here, in the case of the first embodiment, in the group of the amplifier circuit 3 indicated by "LARGE DELAY", the load is relatively large but the delay time is long, so that the output time interval of the power supply current increases in the signal line 12. Thus, although the power supply current flowing through one signal line 12 is large, the time interval between the peaks of the power supply current in the signal line 12 increases as much as the increase in the output time interval. In other words, the overlap of the power supply current waveforms in the signal line 12 relatively decreases. As a result, the graph of the whole power supply current ("B") shows that the increase in the power supply current is moderated when the amplifier circuits 3-1 and 3-960 start outputting, and that both the current peak value and the current rise slope (dI/dt) decrease compared to the case of the graph ("A"). In other words, in the initial stage of the output of the data driver, it is possible to reduce both the current peak value and the current rise slope (dI/dt) even if the output is performed by the group of the amplifier circuit 3 indicated by "LARGE DELAY" in which the load is large.

In this embodiment, the time difference (delay time) of the delay circuit is controlled by the value of the capacitive load due to the length of the liquid crystal display panel signal line 12 on the film carrier, so that the drive timing of the amplifier circuit 3 is delayed. In this way, it is possible to reduce the current peak value that causes the current noise, and to reduce the current rise slope (dI/dt). As a result, it is possible to prevent the incorrect operation that occurs when the noise enters the low voltage logic unit and the interface unit. Further, the strength of electromagnetic interference (EMI) emitted from the power supply line is proportional to the value of dI/dt. Thus, the EMI characteristics can also be improved by reducing the value of dI/dt. In addition, the influence on the resistance element of the power supply line can be reduced by reducing the current peak value. As a result, the problem of power supply voltage drop is less likely to occur in other circuits that share the power supply line.

Note that in the groups of the amplifier circuit 3 indicated by "MEDIUM DELAY" and "SMALL DELAY" in the figure, the current peak value is not relatively large. Thus, if the delay time of the delay circuit is reduced to a relatively small value, there is no problem in the reduction of the current peak value and the reduction of the slope of the current rise peak waveform (dI/dt).

Further, in the embodiment described above, the amplifier drive signal (control signal) CTR is supplied from the amplifier circuit 3 coupled to the line with a large load capacitance, to the amplifier circuit 3 coupled to the line with a medium load capacitance, and to the amplifier circuit 3 coupled to the line with a small load capacitance. However, the present embodiment is not limited to this example. For example, even in the reverse order, current noise may occur when the amplifier circuit 3 coupled to the line with a large capacitance is driven, if the current is rapidly rises and the peak of the current increases because of the large load capacitance. In such a case, this embodiment can also reduce the noise by controlling the time difference (delay time) of the delay circuit to delay the timing for driving the amplifier circuits 3. However, in this embodiment, the time when the power supply current of a certain amplifier circuit flows is longer than the time when the next amplifier circuit starts outputting. In this case, the peak value of the power supply current can be minimized by allowing the amplifier circuit, which is coupled to the line in which the load capacitance is large with the highest peak of the power supply current, to output first. From this point of view, this order is more preferable.

Second Embodiment

The configuration of a display device and a data driver according to a second embodiment of the present invention will be described. In this embodiment, the delay circuit in the data driver is different from the delay circuit in the first embodiment. The following description will mainly focus on this difference.

Figure 15:
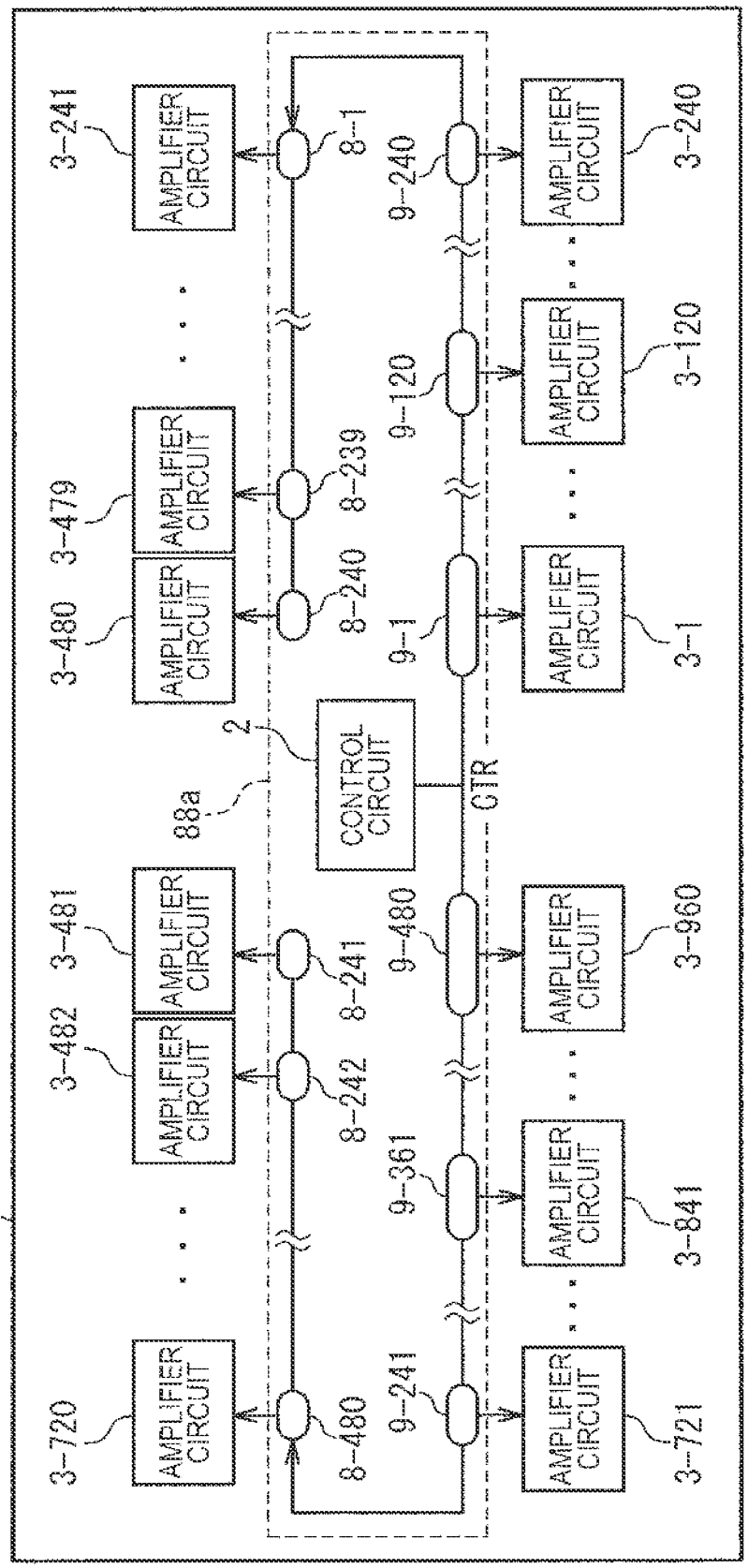
FIG. 15 is a block diagram showing an example of the configuration of a data driver according to a second embodiment of the present invention.

FIG. 15 is a block diagram showing an example of the configuration of a data driver of a display device according to the second embodiment of the present invention. In the data driver 1 according to the first embodiment, the delay circuit is broadly divided into three parts based on the load of the signal line 12 (the delay circuits 6, 7, and 8). On the other hand, in a data driver 1a according to the second embodiment, the delay time by the delay circuit is gradually changed according to the gradual change in the length of the signal line 12 of the amplifier circuit 3. This will be described in detail below.

An amplifier circuit drive unit 88a of the data driver 1a includes a control circuit 2 and delay circuits 8, 9. An amplifier circuit 86 (not shown) of the data driver 1a includes the amplifier circuit 3 (3-1 to 3-960).

The control circuit 2 outputs an amplifier drive signal CTR (control signal) to each of the delay circuits 8 and 9, in order to drive the amplifier circuit 3. However, the control circuit 2 is not necessarily provided within the data driver 1. In this case, the control circuit 2 supplies the amplifier drive signal (control signal) CTR to the delay circuits 8, 9 from the outside of the amplifier circuit drive unit 88a (e.g., from the timing controller 52).

The delay circuit (8, 9) is provided corresponding to the amplifier circuit 3. In other words, one delay circuit corresponds to one amplifier circuit 3. In this embodiment, the delay time by the delay circuit is gradually changed according to the gradual change in the length (the magnitude of the load capacitance) of the signal line 12 coupled to the corresponding amplifier circuit 3. More specifically, delay circuits 9-1 to 9-240 and 9-480 to 9-241 in which the delay time is long and gradually reduced, are used for the amplifier circuits 3-1 to 3-240 and 3-960 to 3-721 (the lower right amplifier circuit group and the lower left amplifier circuit group) in which the length of the signal line 12 is long and gradually reduced (the load capacitance is large and gradually reduced). While the delay circuits 8-1 to 8-480, in which the delay time is short and constant, are used for the amplifier circuits 3-241 to 3-720 (the upper right amplifier circuit group and the upper left amplifier circuit group) in which the length of the signal line 12 is short and substantially constant (the load capacitance is small and substantially constant). The configuration of the delay circuit 8 is the same as the first embodiment.

In this case, with respect to the delay circuit 9, the delay time of the delay circuits 9-1 and 9-480 is the longest, and the delay time of the delay circuits 9-240 and 9-241 is the shortest. Then, the delay circuits 9-1 and 9-480 with the longest delay time are coupled to the amplifier circuits 3-1 and 3-960 in which the signal line 12 to be coupled is the longest (or the load capacitance is the largest). The delay circuits 9-240 and 9-241 with the shortest delay time are coupled to the amplifier circuits 3-240 and 3-721 in which the signal line 12 to be coupled is the shortest (or the load capacitance is the smallest). Note that the delay time of the delay circuit 8 is shorter than any of the delay times of the delay circuit 9.

The delay circuit 9-1 to the delay circuit 9-240 and the delay circuit 8-1 to the delay circuit 8-240 are coupled to the control circuit 2 in series in this order. Further, the delay circuit 9-480 to the delay circuit 9-241 and the delay circuit 8-480 to the delay circuit 8-241 are coupled to the control circuit 2 in series in this order. The two serially coupled delay circuit arrays are coupled to the control circuit 2 in parallel.

Each of the delay circuits 9-1 to 9-240 and 8-1 to 8-240 outputs the control signal, which is delayed by the previous delay circuit, as the delay control signal to the corresponding one of the amplifier circuits 3-1 to 3-240 and 3-241 to 3-480. At the same time, each of the delay circuits 9-1 to 9-240 and 8-1 to 8-240 delays the control signal and outputs to the following delay circuit. Similarly, each of the delay circuits 9-480 to 9-241 and 8-480 to 8-241 outputs the control signal, which is delayed by the previous delay circuit, as the delay control signal to the corresponding one of the amplifier circuits 3-960 to 3-721 and 3-720 to 3-481. At the same time, the each of the delay circuits 9-480 to 9-241 and 8-480 to 8-241 delays the control signal and outputs to the following delay circuit.

In other words, the amplifier drive signal CTR of the control circuit 2 is sequentially delayed and transmitted from the delay circuit 9-1 to the delay circuit 9-240, and then is sequentially delayed and transmitted from the delay circuit 8-1 to the delay circuit 8-240. At the same time, the amplifier drive signal CTR is sequentially delayed and transmitted from the delay circuit 9-480 to the delay circuit 9-241, and then is sequentially delayed and transmitted from the delay circuit 8-480 to the delay circuit 8-241. Each delay circuit (8, 9) is coupled to the corresponding amplifier circuit 3. Note that the delay circuit 142 can also be applied to this embodiment in order to provide a delay time difference between the left and right sides of the chip shown in FIG. 3.

At this time, as described above, the delay time of the delay circuits is different in each of the two groups (9-1 to 9-480: 8-1 to 8-480). Then, in the two groups, the delay time of the delay circuits 9-1 to 9-240 and 9-480 to 9-241 belonging to the previous group is longer than the delay time of the delay circuits 8-1 to 8-240 and 8-480 to 8-241 belonging to the following group.

Further, in the delay circuits 9-1 to 9-480 and 8-1 to 8-480, the delay time of the previous delay circuits is more than the delay time of the following delay circuits as a whole. In particular, in the delay circuits 9-1 to 9-240 and 9-480 to 9-241, the delay time of the previous delay circuit is longer than the delay time of the following delay circuit. Further, the delay time of the previous delay circuits 9-240 and 9-241 is longer than the delay time of the following delay circuits 8-1 and 8-480, respectively.

Other configurations are the same as those in FIG. 11.

Further, the operation of the data driver according to the second embodiment of the present invention is the same as the first embodiment, except that the delay time is different.

According to this embodiment, the same effects as those of the first embodiment can be obtained. Further, in this embodiment as compared to the first embodiment, the timing for driving the amplifier circuit 3 can be finely controlled by increasing the number of types of the delay circuit 9 with different amount of delay. As a result, it is possible to further reduce the current peak value by the drive of the amplifier circuit, and to further reduce the current rise slope (dI/dt).

Third Embodiment

The configuration of a display device and a data driver according to a third embodiment of the present invention will be described. In this embodiment, the delay circuit of the data driver is different from the delay circuit in the first embodiment. The following description will mainly focus on the difference.

Figure 16:
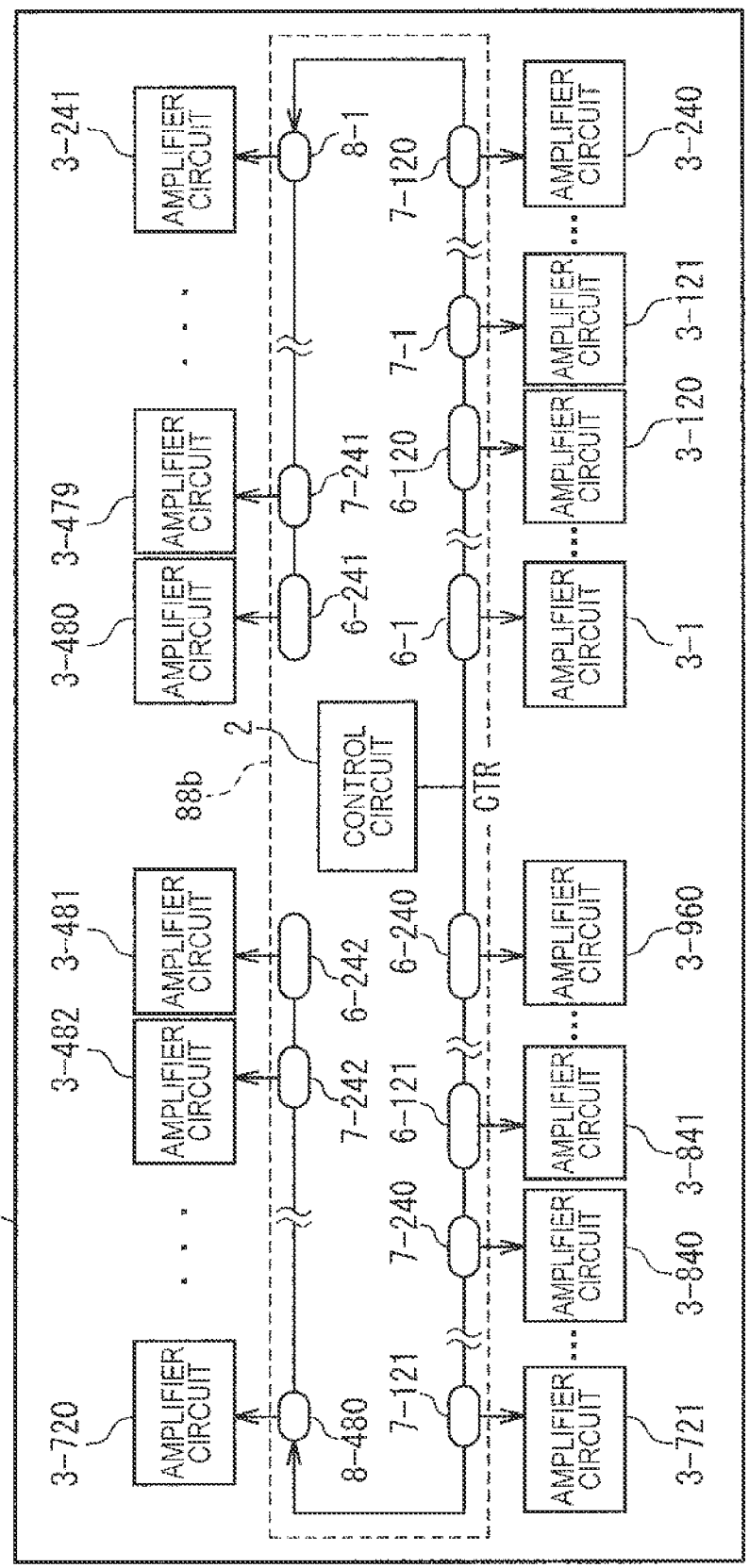
FIG. 16 is a block diagram of an example of the configuration of a data driver according to a third embodiment.

FIG. 16 is a block diagram showing an example of the configuration of a data driver of a display device according to the third embodiment of the present invention. In the data driver 1 according to the first embodiment, the delay circuit is broadly divided into three groups based on the load of the signal line 12, in which the delay time is gradually reduced (from large delay to medium delay, and to small delay). On the other hand, a data driver 1b according to the third embodiment also includes a delay circuit after the particular delay circuit groups to increase again the delay time (to medium delay or large delay after small delay). This will be described in detail below.

In the data driver 1b, delay circuits 6-1 to 6-120, 6-121 to 6-240 with the long delay time are coupled to the amplifier circuits 3-1 to 3-120, 3-841 to 3-960 with the long signal line 12. Further, the delay circuits 7-1 to 7-120, 7-121 to 7-240 with the medium delay time are coupled to the amplifier circuits 3-121 to 3-240, 3-721 to 3-840 with the medium-length signal line 12. Then, the delay circuits 8-1 to 8-480 with the short delay time are coupled to the amplifier circuits 3-241 to 3-478, 3-720 to 3-483 with the short signal line 12. This is the same as the data driver 1 in the first embodiment. However, delay circuits 7-241, 7-242 with the medium delay time are coupled to the amplifier circuits 3-479, 3-482 with the short signal line 12. Further, delay circuits 6-241, 6-242 with the long delay time are coupled to the amplifier circuits 3-480, 3-481 with the short signal line 12.

In other words, in the serially coupled delay circuits, the further the delay circuit is separated from the control circuit 2, the shorter the delay time of the delay circuit is. On the other hand, the delay time is increased in the delay circuit on the farthest side of the control circuit 2. In the example of this figure, the delay time of the two delay circuits (7-241 and 6-241, 7-242 and 6-242) on the farthest side of the control circuit 2 is gradually increased (from 7-241 to 6-241 and from 7-242 to 6-242). However, the present embodiment is not limited to this example. It is also possible to increase the delay time in one delay circuit or in two or more delay circuits on the farthest side of the control circuit 2.

Other configurations are the same as the configurations in FIG. 11.

Further, the operation of the data driver according to the third embodiment of the present invention is the same as the first embodiment, except that the delay time is different.

According to this embodiment, the same effects as those of the first embodiment can be obtained. Further, in this embodiment, the following effect can also be obtained. In FIG. 14B, in the case "B" (the current waveform in the first embodiment), the rise of the current waveform is improved by the reduction in the current peak and the current rise slope (dI/dt) at the start of the drive of the amplifier circuit. Thus, the influence of the rising slope of the current waveform (dI/dt) is relatively large. Due to this phenomenon, the influence of the noise generated in other signal lines by the parasitic capacitance and the mutual induction is relatively large in the fall of the current waveform. Thus, this embodiment also reduces the slope in the fall of the current waveform in which the current decreases. In this way, it is possible to prevent a rapid change in the rise and fall time of the current. As a result, it is possible to further prevent the occurrence of noise and further prevent incorrect operation of the circuit.

Figure 17A:
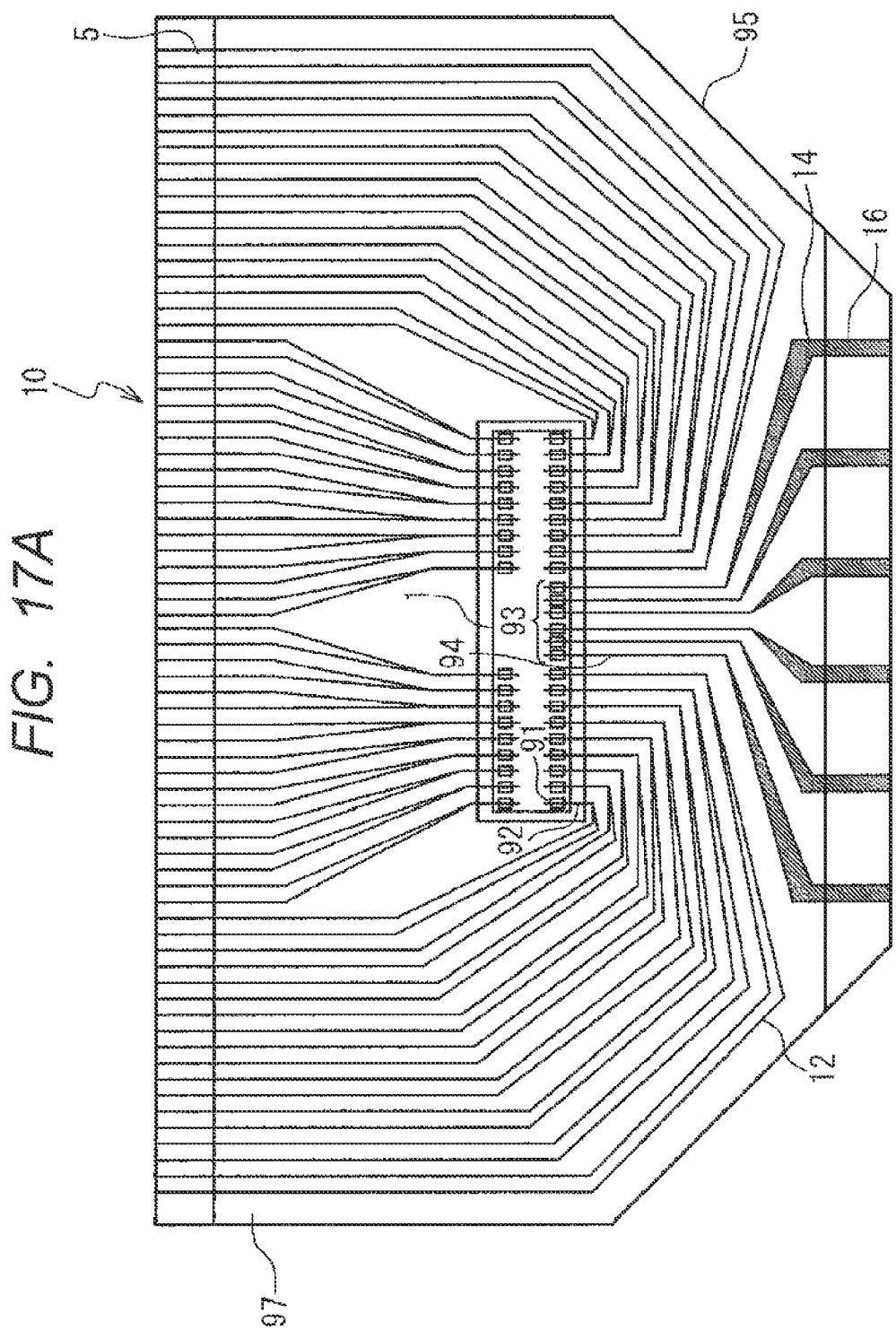
FIG. 17A is a schematic diagram showing a specific example of the display panel driving device with the data driver mounted on the film carrier package shown in FIG. 10.
Figure 17B:
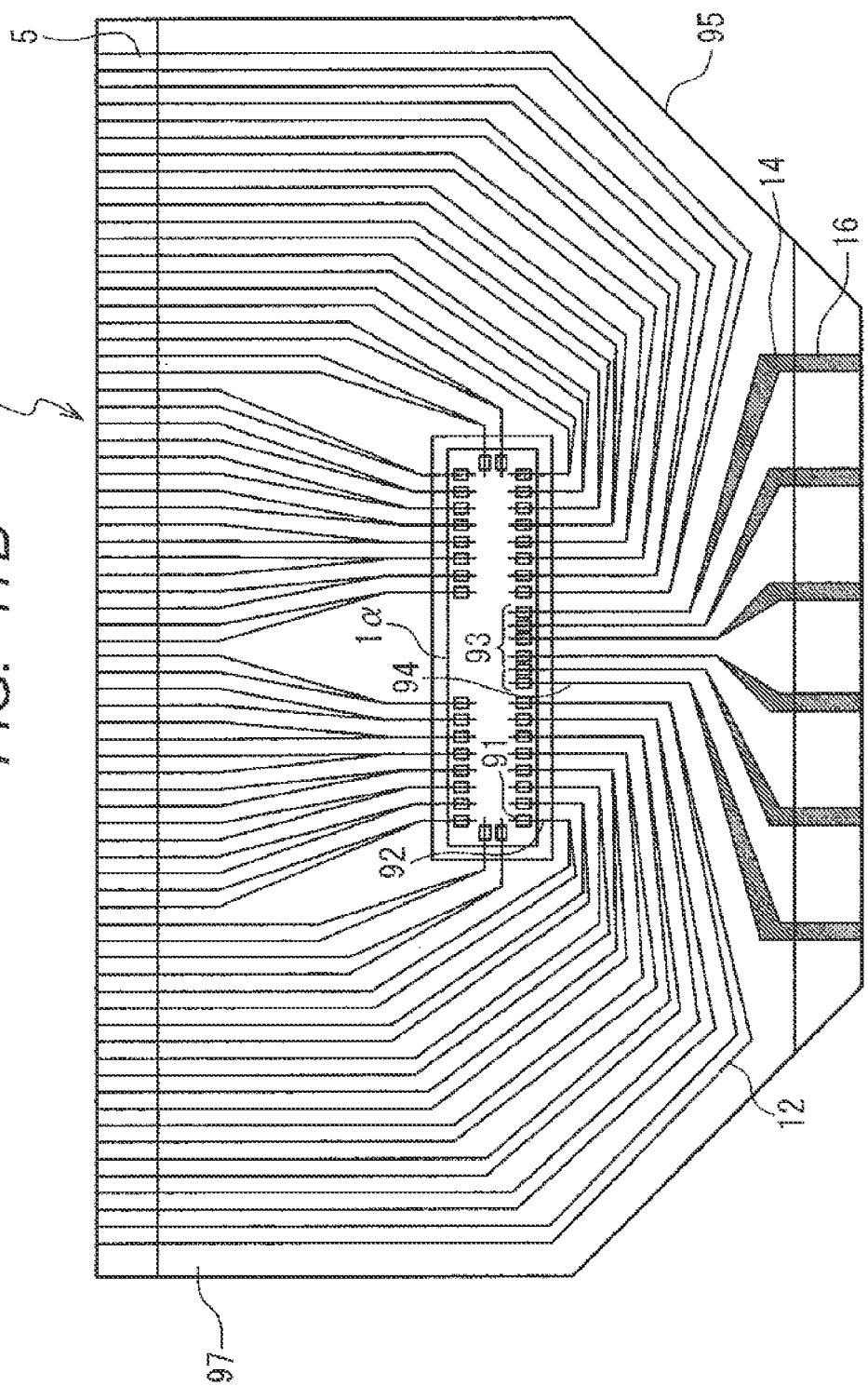
FIG. 17B is a schematic diagram of a variation of the display panel driving device with the data driver mounted on the film carrier package shown in FIG. 10.
Figure 17C:
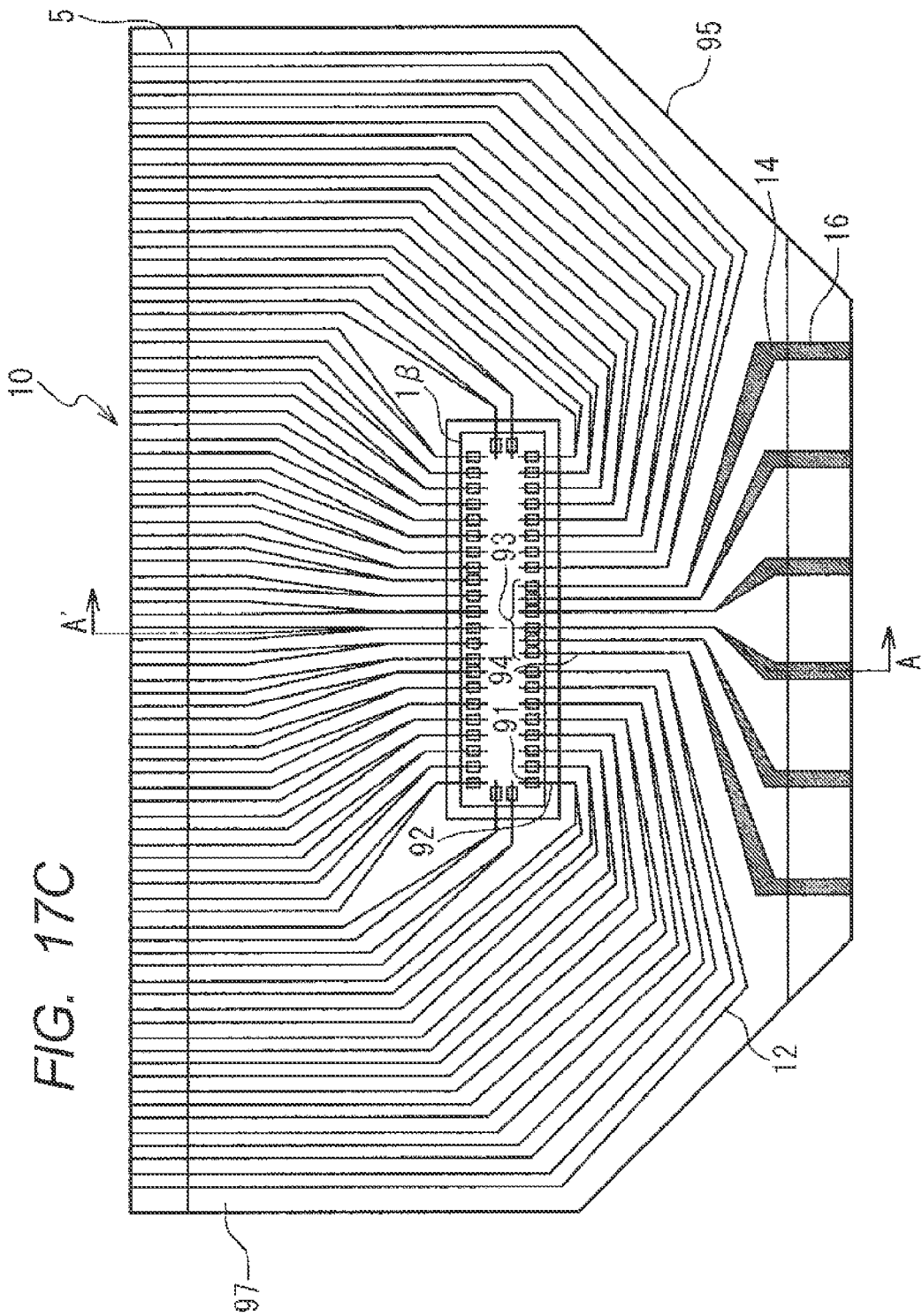
FIG. 17C is a schematic diagram of another variation of the display panel driving device with the data driver mounted on the film carrier package shown in FIG. 10.

FIGS. 17A to 17C are schematic diagrams of specific examples or variations of the display panel driving device with the data driver mounted on the film carrier package 10 shown in FIG. 10. The display panel driving device includes the data driver 1, a data driver 1α or data driver 1β, and the package 10.

Referring to FIG. 17A, the data driver 1 is mounted on the package 10. In the example of this figure, the data driver 1 has bumps 91, which are output terminals arranged in rows in the vicinity of the two long sides of the chip as the chip layout. The data driver 1 includes one amplifier circuit 3 (not shown) corresponding to one bump 91. An inner lead 92 coupled to the bump 91 is coupled to the signal line 12 (lead). The signal line 12 (lead) is coupled to a node 5 (output lead terminal; outer lead). Further, bumps 93 as input terminals are arranged in rows in the middle of the bumps 91. The inner lead 94 coupled to the bump 93 is coupled to an input signal line 14 (lead). The input signal line 14 (lead) is coupled to an input node 16 (input lead terminal; outer lead). The inner leads 92 and 94, the signal lines 12, and the input signal lines 14 are provided in a tape 95. The inner leads 92 and 94 are covered by a sealing resin (not shown, see FIG. 18). The signal lines 12 (lead) and the input signal lines 14 are covered by an insulating film (solder resist) 97. However, the data driver 1 can also be the data driver 1*a* or 1*b*.

Referring to FIG. 17B, the data driver 1α and the package 10 are substantially the same as the data driver 1 and the package 10 shown in FIG. 17A. However, the data driver 1α is different from the data driver 1 of FIG. 17A in that the data driver 1α has the bumps 91, which are output terminals arranged in rows not only in the vicinity of the two long sides of the chip, but also in the vicinity of the two short sides of the chip as the chip layout. However, the data driver 1α can have the configuration of the data driver 1*a* or 1*b*.

Referring to FIG. 17C, the data driver 1β and the package 10 are substantially the same as the driver 1 and the package 10 shown in FIG. 17B. However, the data driver 1β is different from the data driver 1 of FIG. 17B in that the data driver 1β has the bumps 91, which are output terminals arranged in rows also in the area facing the bumps 93, which are input terminals arranged in rows in the vicinity of the two long sides of the chip as the chip layout. However, the data driver 1β can have the configuration of the data driver 1*a* or 1*b*.

Figure 18:
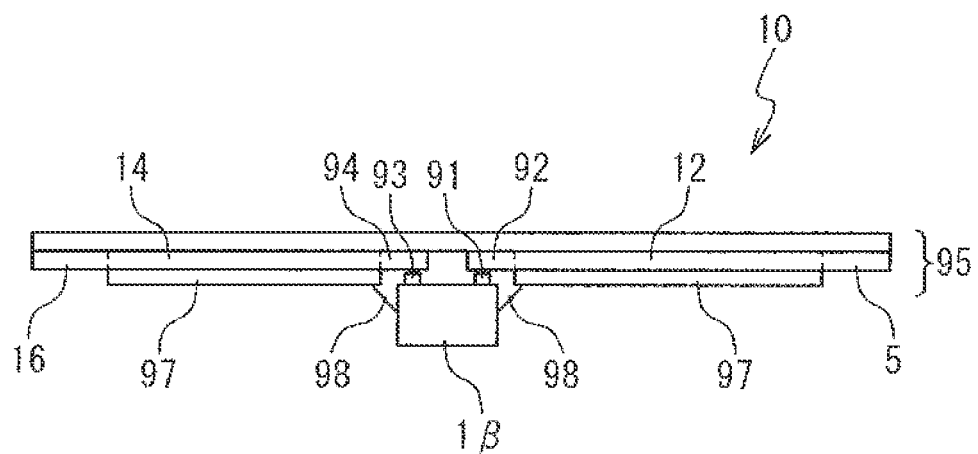
FIG. 18 is a cross-sectional view taken along line A-A' in FIG. 17C.

FIG. 18 is a cross-sectional view taken along line A-A' in FIG. 17C. In the example of this figure, the tape (shaped line) 95 includes a substrate film 96, an inner lead 92 provided on the substrate film 96, the signal line 12 (lead), the node 5 (output lead terminal; outer lead), the inner lead 95, the input signal line 14 (lead), and an input node 16 (input lead terminal; outer lead). In the data driver 1, the bumps 91 and 93 are coupled to the inner leads 92 and 94. The inner leads 92 and 94 as well as the bumps 91 and 93 of the data driver 1β are covered by a sealing resin 98. The signal line 12 (lead) and the input signal line 14 are covered by an insulating film (solder resist) 97. FIGS. 17A and 17B have the same cross-sectional structure as FIG. 18.

The data drivers shown in FIGS. 17A to 17C (and FIG. 18) can be applied to the first to third embodiments and the effects of these embodiments can be obtained.

Further, the above description exemplifies the data driver of the liquid crystal display. However, the present invention can also be applied to data drivers of other types of displays having the same function. Furthermore, the above description exemplifies the analog circuit (analog circuit-signal line-display panel load). However, the present invention can also be applied to a digital circuit having the same function. In other words, the present invention can also be applied to a digital circuit for simultaneously outputting a plurality of digital data pieces through a plurality of signal lines arranged in parallel.

The present invention is not limited to the above-described embodiments, and it will be apparent to those skilled in the art that numerous variations or modifications may be made in these embodiments without departing from the technical scope of the present invention. Further, techniques described in relation to a particular embodiment can also be applied to other embodiments unless inconsistency arises.

What is claimed is:

1. A data driver comprising:
   a delay unit that sequentially delays a control signal and outputs a plurality of delay control signals; and
   a plurality of output circuits that start outputting in response to a corresponding delay control signal of the delay control signals,
   wherein the delay unit generates the delay control signals to be output to the output circuits, respectively, so that a first time difference between a first output start time of a first output circuit coupled to a line with a relatively large load capacitance of the output circuits and a second output start time of a second circuit that is immediately following or immediately previous to the first output circuit is larger than a second time difference between a third output start time of a third output circuit coupled to a line with a relatively small load capacitance of the output circuits and a fourth output start time of a fourth circuit that is immediately following or immediately previous to the third output circuit.

2. The data driver according to claim 1,
   wherein the delay unit includes a plurality of delay circuits for outputting the delay control signals,
   wherein the delay circuits are coupled in series,
   wherein, of the delay circuits, a delay circuit coupled to an output circuit that is coupled to the line with a relatively large load capacitance, has a long delay time, and
   wherein, of the delay circuits, a delay circuit coupled to an output circuit that is coupled to the line with a relatively small load capacitance, has a short delay time.

3. The data driver according to claim 2,
   wherein, of the serially coupled delay circuits, the operation order of a delay circuit coupled to an output circuit that is coupled to the line with a relatively large load capacitance is prior to the operation order of a delay circuit coupled to an output circuit that is coupled to the line with a relatively small load capacitance.

4. The data driver according to claim 2,
   wherein the delay circuits include a plurality of groups, and
   wherein the delay time of the delay circuits is different in each of the groups.

5. The data driver according to claim 4,
   wherein in at least some of the groups, the delay time of the delay circuit belonging to the group coupled to the output circuit that is coupled to the line with a relatively large load capacitance is longer than the delay time of the delay circuit belonging to the group coupled to the output circuit that is coupled to the line with a relatively small load capacitance.

6. The data driver according to claim 3, further comprising another delay circuit placed after the delay circuits and having a delay time longer than the delay time of the last delay circuit of the particular delay circuits.

7. The data driver according to claim 2,
   wherein in at least some of the delay circuits, the delay time of the delay circuit coupled to the output circuit that is coupled to the line with a relatively large load capacitance is longer than the delay time of the delay circuit coupled to the output circuit that is coupled to the line with a relatively small load capacitance.

8. The data driver according to claim 2,
   wherein, of the delay circuits, a first delay circuit for outputting a first delay control signal to the first output circuit coupled to the line with a relatively large capacitance delays the control signal by a first delay time,
   wherein, of the delay circuits, a second delay circuit for outputting a second delay control signal to the second output circuit after the first output circuit delays the control signal by a second delay time,
   wherein, of the delay circuits, a third delay circuit for outputting a third delay control signal to the third output circuit coupled to the line with a relatively small load capacitance delays the control signal by a third delay time, wherein, of the delay circuits, a fourth delay circuit for outputting a fourth delay control signal to the fourth output circuit after the third output circuit delays the control signal by a fourth delay time, wherein the first delay time is greater than the second delay time, wherein the second delay time is greater than the third delay time, and wherein the third delay time is greater than the fourth delay time.

9. A display panel driving device comprising:

the data driver according to claim 1; and a package coupled to the data driver and having a plurality of lines with different load capacitances.

10. A display device comprising:

the display panel driving device according to claim 9;

a gate driver; and a display panel, wherein the display panel includes a data line driven by the display panel driving device and a gate line driven by the gate driver.

11. A data driver operation method comprising outputting a control signal;

generating a plurality of delay control signals to be output to a plurality of output circuits, respectively, so that a first time difference between a first output start time when a first output circuit coupled to a line with a relatively large load capacitance of the output circuits outputs an output voltage and a second output start time when a second circuit that is immediately following or immediately previous to the first output circuit outputs an output voltage is larger than a second time difference between a third output start time when a third output circuit coupled to a line with a relatively small load capacitance of the output circuits outputs an output voltage and a fourth output start time when a fourth circuit that is immediately following or immediately previous to the third output circuit outputs an output voltage; and outputting the delay control signals to the output circuits, respectively, wherein each of the output circuits outputs the output voltage in response to each of the delay control signals.

* * * * *